(12) United States Patent
Seidemann et al.

(10) Patent No.: US 11,177,220 B2
(45) Date of Patent: Nov. 16, 2021

(54) VERTICAL AND LATERAL INTERCONNECTS BETWEEN DIES

(71) Applicant: Intel Corporation, Santa Clara, CA (US)

(72) Inventors: Georg Seidemann, Landshut (DE); Andreas Wolter, Regensburg (DE); Bernd Waidhas, Pettendorf (DE); Thomas Wagner, Regelsbach (DE)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 16/490,521

(22) PCT Filed: Apr. 1, 2017

(86) PCT No.: PCT/US2017/025654
§ 371 (c)(1),
(2) Date: Aug. 30, 2019

(87) PCT Pub. No.: WO2018/182754
PCT Pub. Date: Oct. 4, 2018

(65) Prior Publication Data
US 2020/0126922 A1   Apr. 23, 2020

(51) Int. Cl.
*H01L 23/538* (2006.01)
*H01L 21/48* (2006.01)
(Continued)

(52) U.S. Cl.
CPC ...... *H01L 23/5387* (2013.01); *H01L 21/4857* (2013.01); *H01L 23/367* (2013.01);
(Continued)

(58) Field of Classification Search
None
See application file for complete search history.

(56) References Cited

U.S. PATENT DOCUMENTS

2005/0184376 A1   8/2005 Salmon
2014/0252647 A1*  9/2014 Huang ............... H01L 23/5389
                                          257/774

FOREIGN PATENT DOCUMENTS

DE   102004010649 A1   11/2004
FR        2754416      12/1998

OTHER PUBLICATIONS

International Search Report dated Nov. 29, 2017, in International Application No. PCT/US2017/025654, filed Apr. 1, 2017; 3 pages.

* cited by examiner

*Primary Examiner* — Moazzam Hossain
*Assistant Examiner* — Stanetta D Isaac
(74) *Attorney, Agent, or Firm* — Schwabe, Williamson & Wyatt, P.C.

(57) ABSTRACT

Electronics devices, having vertical and lateral redistribution interconnects, are disclosed. An electronics device comprises an electronics component (e.g., die, substrate, integrated device, etc.), a die(s), and a separately formed redistribution connection layer electrically coupling the die(s) to the electronics component. The redistribution connection layer comprises dielectric layers on either side of at least one redistribution layer. The dielectric layers comprise openings that expose contact pads of the at least one redistribution layer for electrically coupling die(s) and components to each other via the redistribution connection layer. The redistribution connection layer is flexible and wrap/folded around side edges of die(s) to minimize vertical vias. Various devices and associated processes are provided.

25 Claims, 16 Drawing Sheets

(51) Int. Cl.
*H01L 23/367* (2006.01)
*H01L 23/498* (2006.01)
*H01L 23/00* (2006.01)
*H01L 25/065* (2006.01)

(52) U.S. Cl.
CPC ........ *H01L 23/49822* (2013.01); *H01L 24/16* (2013.01); *H01L 25/0657* (2013.01); *H01L 2224/16227* (2013.01)

VERTICAL AND LATERAL INTERCONNECTS BETWEEN DIES

PRIORITY INFORMATION

This application is a 371 U.S. national stage entry of PCT Application Ser. No. PCT/US2017/025654, filed Apr. 1, 2017, which is incorporated herein by reference in its entirety.

TECHNICAL FIELD

Embodiments described herein relate generally to devices having vertical and lateral interconnects via a separately formed redistribution connection layer.

BACKGROUND

Semiconductor packages and devices/platforms that house the packages, such as wearable devices and mobile products, are getting smaller and smaller. Therefore, package size requirements are progressively shrinking while electrical supply requirements to dies remain the same or increase.

Vertical (electrical) connections in semiconductor packages are realized by through-mold-vias (TMVs) and through-silicon-vias (TSVs) and/or wire bonds from a substrate to stacked dies, for instance. However, such architectures limit the amount of vertical connections that can be realized throughout a package, particularly considering package size requirements are increasingly stringent. Typically, once dies are stacked onto a substrate a redistribution layer is formed over the die stack and vertical interconnects are formed between dies and other electronics components. Various redistribution processes exist to form such vertical interconnects once the dies are stacked and attached to each other and to a substrate.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

DESCRIPTION OF EMBODIMENTS

Figure 1A:
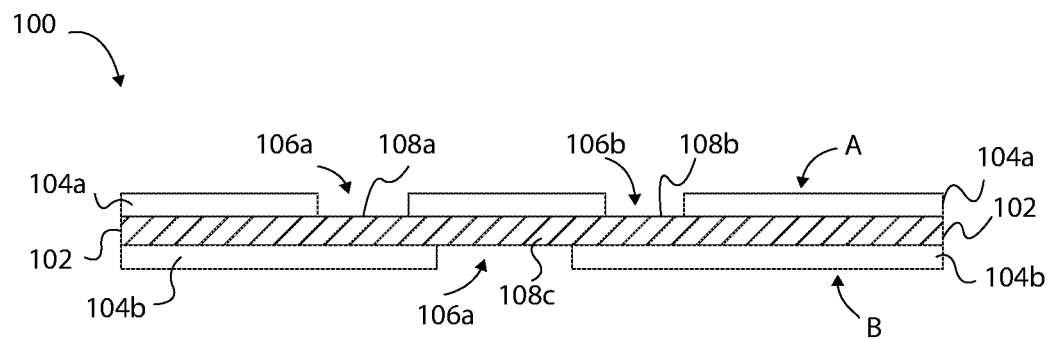
FIG. 1A illustrates a schematic side plan view of a redistribution connection layer in accordance with an example embodiment.

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects, structures, or elements, are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

In one example there is provided an electronics device comprising an electronics component (e.g., die, substrate, integrated device, redistribution layer, etc.), a first die, and a separately formed connection layer electrically coupling the first die to the electronics component. The connection layer comprises a first dielectric layer, a second dielectric layer, and at least one redistribution layer disposed between the first and second dielectric layers. In one example the first dielectric layer comprises a first opening that exposes a first contact pad of the at least one redistribution layer, and the second dielectric layer comprises a second opening that exposes a second contact pad of the at least one redistribution layer. The first contact pad and the second contact pad electrically couple the die to the electronics component, and wherein the connection layer is flexible and configured to wrap around a side edge of a die. The separately formed connection layer is attached to the first die along a first direction and extends from the first die in a second direction transverse to the first direction. In some examples the separately formed connection layer comprises a fold portion that extends from the first die to the electronics component.

FIG. 1A illustrates a schematic side plan view of a redistribution connection layer 100 in accordance with one example of the present disclosure. The redistribution connection layer 100 comprises at least one redistribution layer 102 disposed between a first dielectric layer 104a and a second dielectric layer 104b. Thus, the at least one redistribution layer 102 can be "sandwiched" between the first and second dielectric layers 104a and 104b. The at least one redistribution layer 102 can be comprised of a thin layer of copper, for instance. The first and second dielectric layers 104a and 104b can be comprised of any dielectric material, such as Kapton® or other polyimide films. The first and second dielectric layers 104a and 104b can be laminated, adhered, or otherwise attached to the at least one redistribution layer 102. In one example, the entire assembled redistribution connection layer 100 is comprised of compliant or flexible materials sized to be sufficiently flexible as an assembled redistribution connection layer such that it can wrap around a side edge of a die, as further discussed herein.

In one aspect, the first dielectric layer 104a comprises a first opening 106a and a second opening 106b that exposes first and second contact pads 108a and 108b (e.g. redistribution layer "RDL pads"), respectively, of the at least one redistribution layer 102. The second dielectric layer 104b comprises a third opening 106c that exposes a third contact pad 108c of the at least one redistribution layer 102.

Figure 1B:
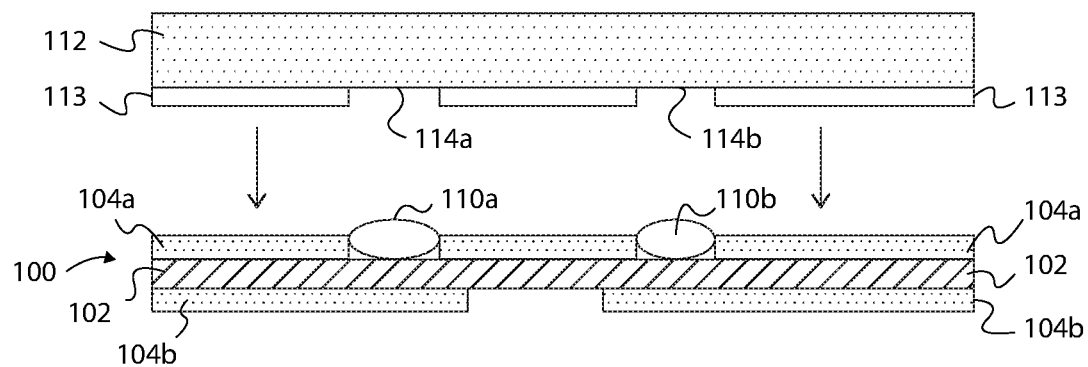
FIG. 1B illustrates a schematic side plan view of the redistribution connection layer of FIG. 1A and a die in accordance with an example embodiment.
Figure 1C:
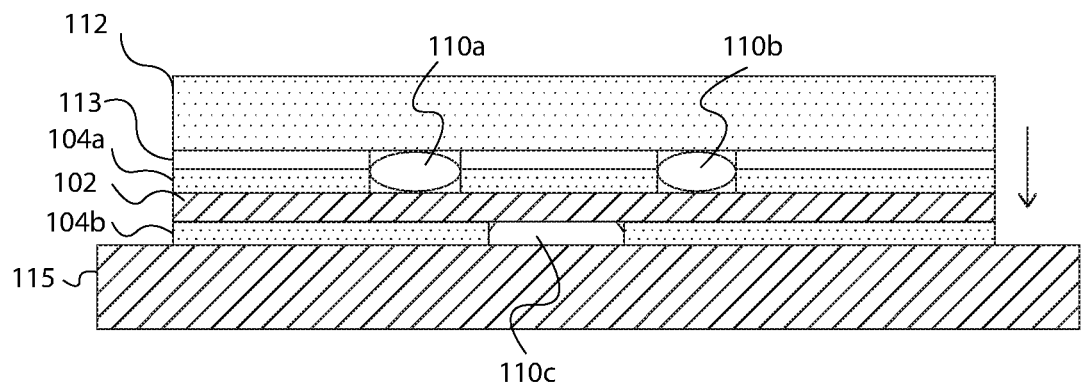
FIG. 1C illustrates a schematic side plan view of the redistribution connection layer attached to the die of FIG. 1B in accordance with an example embodiment.

With regard to FIGS. 1B and 1C, solder components 11a-c can be attached (e.g., soldered) to respective contact pads 108a-c. The solder components 110a-c can comprise solder balls, solder paste, copper pillars, copper bumps, etc. A die 112 can be attached along the first dielectric layer 104a, and comprises first and second contact pads 114a and 114b electrically coupled to the at least one redistribution layer 102 via solder components 110a and 110b. The die 112 can have a dielectric layer 113 with openings that expose the contacts pads of the die 112, in a typical manner. On the other side of the at least one redistribution layer 102, solder component 110c electrically couples the at least one redistribution layer 102 (and the die 112) to an electronics component 115, such as further described below. Thus, the redistribution connection layer 100 is configured to electrically couple the die 112 to another electronics component 115, such as other die(s), a substrate, an integrated device, etc.

In one aspect, an adhesive film (not shown) can be disposed along outer surfaces of each of the first and second dielectric layers 104a and 104b to provide an attachment mechanism along the dielectric layers 104a and 104b to a die, substrate, electronics component, etc. Advantageously, the redistribution connection layers (e.g., 100, 101) discussed herein can be formed or manufactured independently or separately of processes that attach a die to an electronics component. That is, the connection layers discussed herein can be formed prior to, or independently of, any back-end-of-line (BEOL) fabrication processes. In one aspect, the dielectric layers 104a and 104b can be attached to the at least one distribution layer 102 prior to prior to package forming processes, for instance. In one aspect, the redistribution connection layers discussed herein can be formed (with or without openings) and then rolled as "tape" that can be unrolled and used for various attachment purposes discussed herein.

Figure 1D:
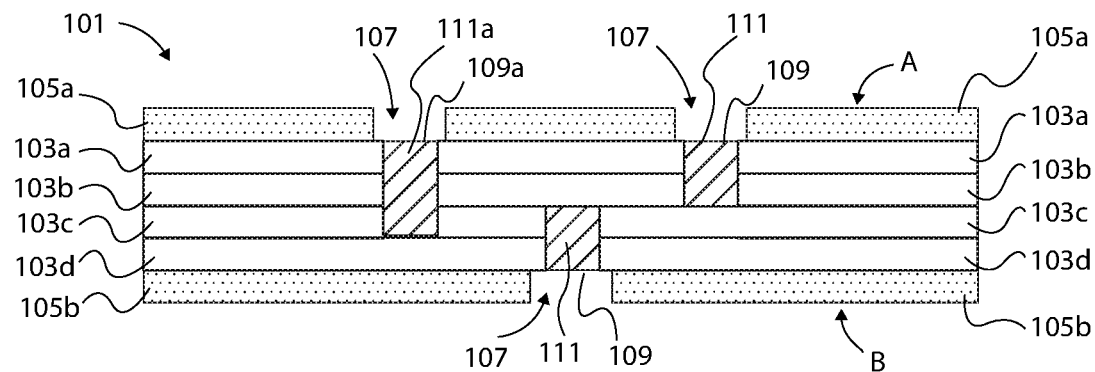
FIG. 1D illustrates a schematic side plan view of a redistribution connection layer in accordance with an example embodiment.
Figure 1E:
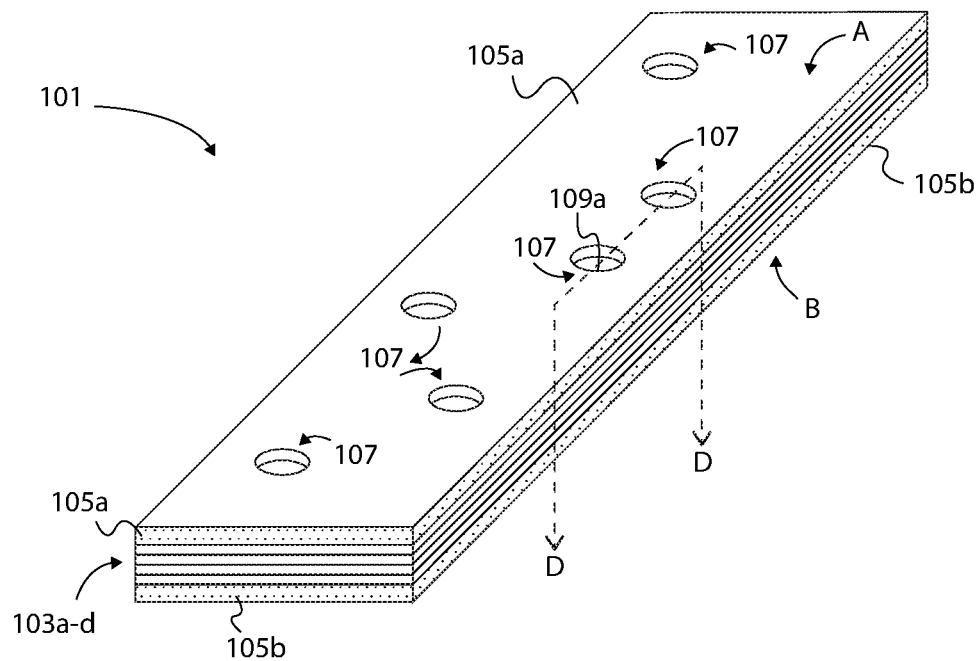
FIG. 1E illustrates an isometric plan view of a redistribution connection layer in accordance with an example embodiment.

FIG. 1D illustrates a schematic side plan view of a portion of a redistribution connection layer 101 (about lines D-D of FIG. 1E), and FIG. 1E shows an isometric plan view of a portion of the redistribution connection layer 101, in accordance with one example of the present disclosure. The connection layer 101 comprises a plurality of redistribution layers 103a-d stacked adjacent each other and collectively disposed between a first dielectric layer 105a and a second dielectric layer 105b (note that the long side edges of the plurality of redistribution layers 103a-d of FIG. 1E are shown as exposed for illustration purposes, and would not necessarily be exposed in a final assembly; the dielectric layers may wrap around or encase such long side edges). The plurality of redistribution layers 103a-d can be comprised of copper and can be laterally isolated from each other (e.g., by a dielectric film or other such feature). The first and second dielectric layers 105a and 105b can be comprised of any dielectric material, such as Kapton® or other polyimide films. The first and second dielectric layers 105a and 105b can be laminated, adhered, or otherwise attached to either side of the plurality of redistribution layers 103a-d. The entire assembled redistribution connection layer 101 is comprised of material and is sized to be sufficiently flexible such that it can wrap around a side edge of a die, as further discussed herein.

In one aspect, one or both of the dielectric layers 105a and 105b can comprise a plurality of openings 107 that expose a plurality of contact pads 109. The openings 107 can be formed during formation of the connection layer 101 or after formation, such as via laser tracing or other suitable means. A plurality of vias 111 can be disposed about the plurality of redistribution layers 103a-d. For example, a first via 111a can be attached to redistribution layer 103d and can extend vertically through adjacent (isolated) redistribution layers 103a-c and to create contact pad 109a for electrically coupling to redistribution layer 103d to a die or other electronics component. Other vias can be similarly distributed throughout a particular connection layer to suit a particular architecture scheme.

In one aspect, an adhesive film (not shown) can be disposed along outer faces of each of the first and second dielectric layers 105a and 105b to provide an attachment mechanism along the dielectric layers to a die, substrate, electronics component, etc. Advantageously, the connection layer 101 is formed or manufactured separately or independently of processes that attached dies together and/or dies to a substrate, for instance. In one aspect, the dielectric layers 105a and 105b can be attached to distribution layers 103a-d prior to package forming processes. Thus, the connection layer 101 can be formed (with or without openings) and then rolled as "tape" that can be unrolled and used for various attachment purposes discussed herein.

The redistribution connection layers discussed herein (e.g., 100, 101) can generate a fine-pitch connection layer that can wrap around die(s). This is because the openings of the dielectric layers (i.e., that expose contact pads) can be quite small compared to existing redistribution layer (RDL) processes. Thus, because the redistribution connection layer can be produced in high volume flat in advance and in fine-pitch, significantly more vertical connections can be realized that with TSVs, TMVs, or wire bonds. Moreover, the redistribution connection layer (as formed independently), provides greater reliability of attachment and electrical connection as compared to TSVs because tolerances of an RDL can be determined before attaching the redistribution connection layer to any die or components. Moreover, the redistribution connection layer is significantly less expensive than forming TSVs during BEOL fabrication and a greater number of fine-pitches can be realized with the redistribution connection layer as compared to attaching dies to substrates in traditional means.

FIGS. 2A-2E illustrate a schematic side plan view of methods of attaching dies with a redistribution connection layer (e.g., 100 or 101) in accordance with one example of the present disclosure. For purposes of illustration clarity, the openings, contact pads, and solder components (i.e., of FIGS. 1A-1E) are omitted from the redistribution connection layers shown on FIGS. 2A-16C, but it will be appreciated that each side of the (i.e., first and second dielectric layers) of the redistribution connection layers of FIGS. 2A-16C can have a plurality of openings or no openings at all on a particular side. Thus, with reference to FIGS. 2A-16C, side "A" refers to the side having the first dielectric layer (e.g., 104a, 105a), and side "B" refers to the side having the second dielectric layer (e.g., 104b, 105b), as also illustrated on FIGS. 1A, 1D, and 1E.

Figure 2A:
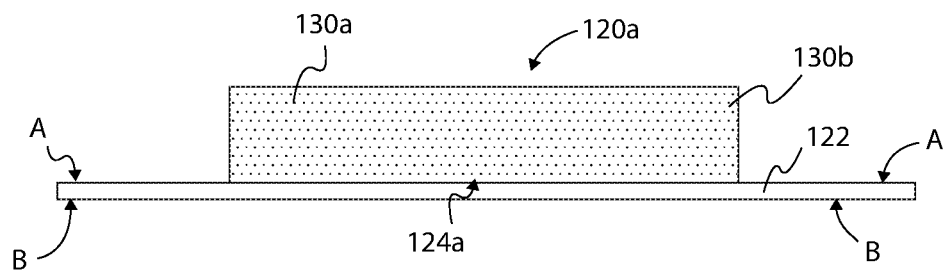
FIGS. 2A-2E illustrate a schematic side plan view of a method of attaching dies with a redistribution connection layer in accordance with an example embodiment.
Figure 2B:
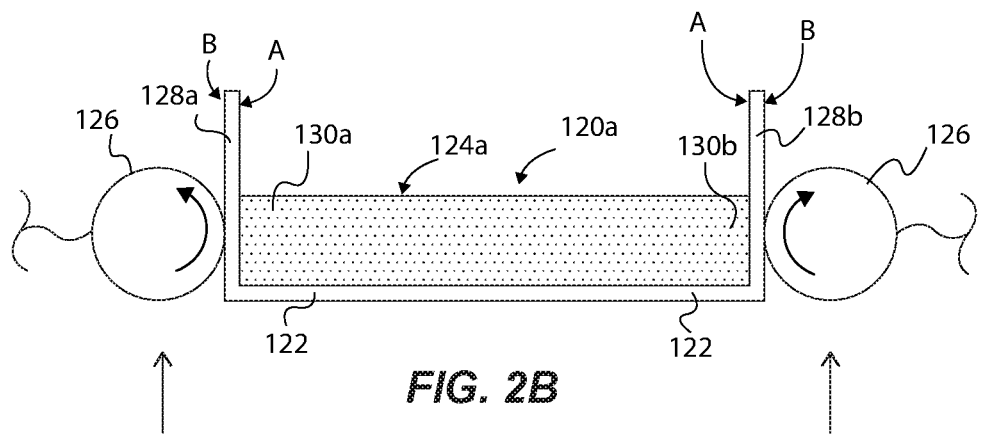
Figure 2C:
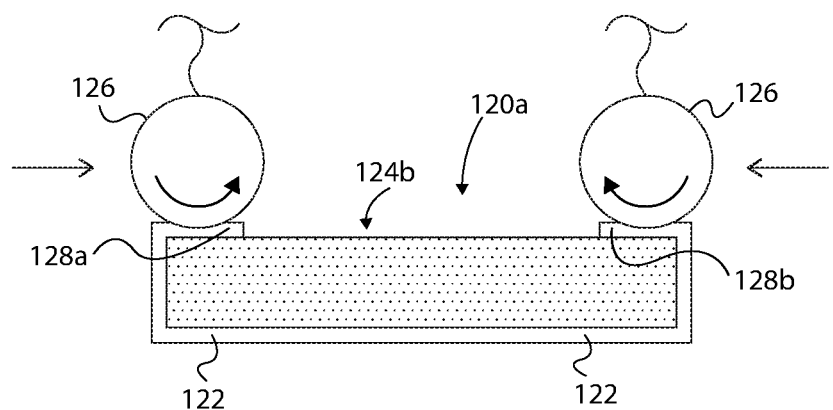

Accordingly, and in one example, FIG. 2A shows a first die 120a attached to side A of a redistribution connection layer 122 along a length of the front side 124a of the first die 120a. Once attached, as shown on FIG. 2B a pair of attachment tools 126 fold or wrap end portions 128a and 128b of the redistribution connection layer 122 around left and right side edges 130a and 130b, respectively, of the first die 120a. The attachment tools 126 can be a programmable, motorized mechanisms with rotatable rubber contact wheels (schematically shown), or other device, configured to cause a pressing force to the connection layer 122 and against the first die 120a (or any die or electronics component) to adhere the connection layer 122 to the first die 120a as the rubber contact wheels traverse relative to the die(s) (as shown by the rotational and directional arrows). Thus, the attachment tools 126 can be positioned adjacent the connection layer 122 and then traversed to fold the end portions 128a and 128b around the first die 120a and attached to the backside 124b of the first die 120a, thereby attaching the entire side A of the redistribution connection layer 122 to the first die 120a.

Figure 2D:
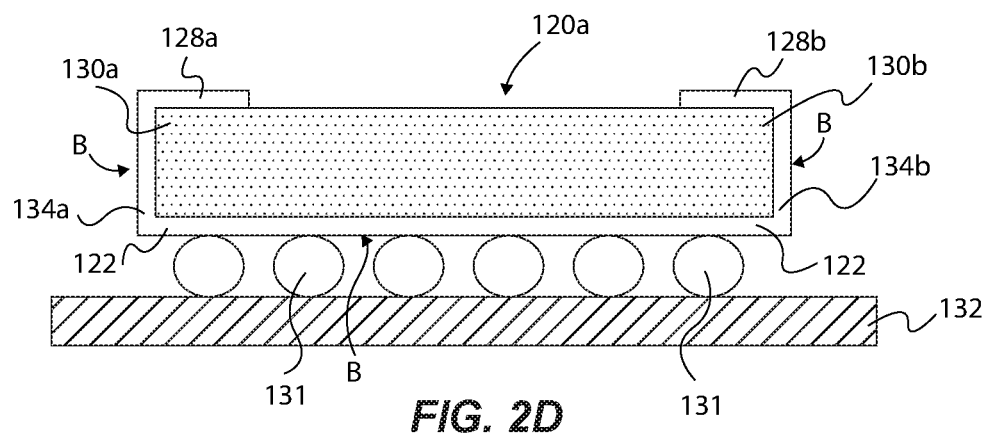

As shown on FIG. 2D, solder components 131 can be attached along respective contact pads along side B of the redistribution connection layer 122, and then the solder components 131 can be electrically and mechanically attached to an electronics component 132, such as a substrate.

Figure 2E:
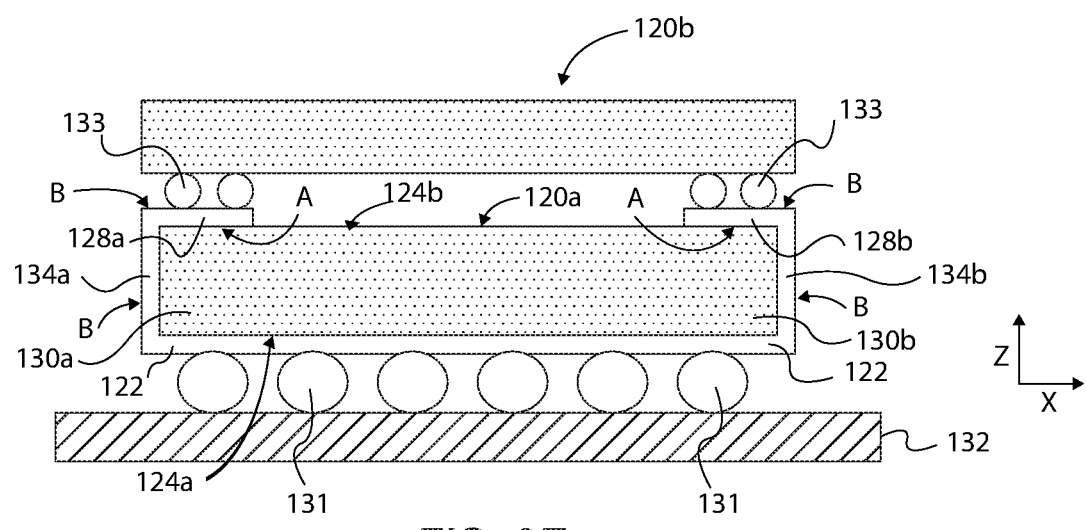

As shown on FIG. 2E, a second die 120b can be stacked on the first die 120a. Specifically, the second die 120b can be attached to side B of the redistribution connection layer 122 proximate end portions 128a and 128b and adjacent the back side 124b of the first die 129a. Thus, the end portions 128a and 128b are disposed between the first and second dies 120a and 120b. The second die 120b can be thermal compression bonded to side B of the redistribution connection layer 122, which therefore electrically couples the second die 120b to the electronics component 132 via side B. In one aspect, the first die 120a is electrically coupled to either of both of the second die 120b and the electronics component 132 via solder components 133 disposed along side B of the redistribution connection layer 122 and attached to the first die 120a. Therefore, the resulting package is devoid of vertical interconnects, such as TSVs or TMVs.

Notably, the redistribution connection layer 122 is attached to the first die 120a along a first direction X (i.e., laterally along the front side 124a of the first die 120a), and the redistribution connection layer 122 extends from the first die 120a in a second direction Z transverse to the first direction X. In this example, the redistribution connection layer 122 has left and right fold portions 134a and 134b that fold around left and right side edges 130a and 130b. Therefore, the redistribution connection layer 122 extends laterally and also vertically along the first die 120a, and the redistribution connection layer 122 is a single, uniform length of a device that electrically couples the first and second dies 120a and 120b to each other and/or to the electronics component 132. This can dramatically minimize (or eliminate) the need for TSVs and TMVs, which reduces process steps when forming package devices than would be required with TSVs and TMVs.

Figure 3A:
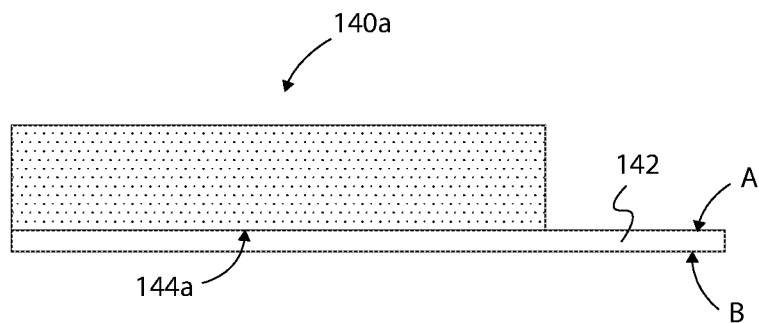
FIGS. 3A-3G illustrate a schematic side plan view of a method of attaching dies with a redistribution connection layer in accordance with an example embodiment.
Figure 3B:
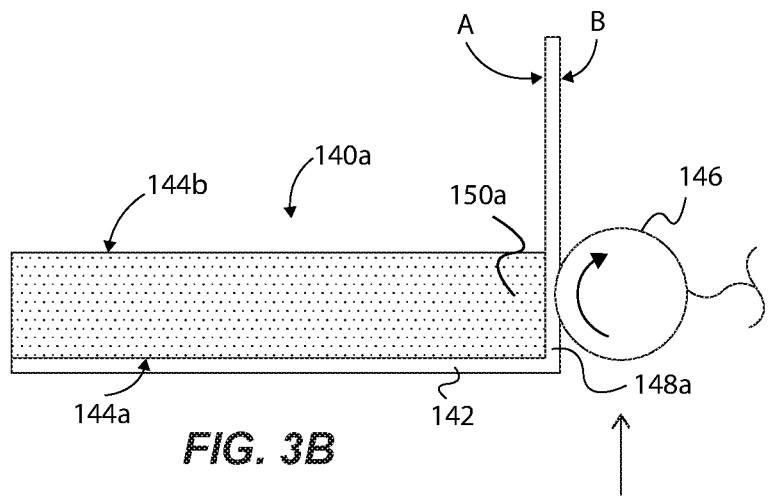
Figure 3C:
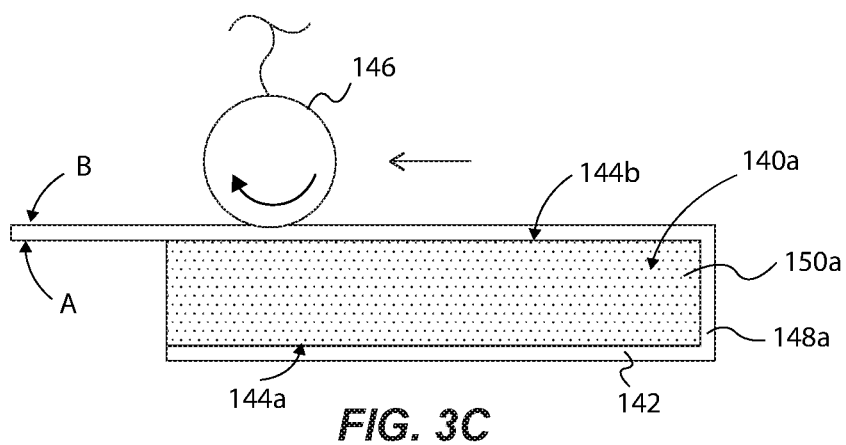

FIGS. 3A-3G show a schematic side plan view of methods of attaching dies with a redistribution connection layer (e.g., 100, 101) in accordance with one example of the present disclosure, similarly as described with reference to FIGS. 2A-2E. Specifically, a first die 140a attached to side A of a redistribution connection layer 142 along a front side 144a of the first die 120a. Once attached, an attachment tool 146 (e.g., such as described regarding FIG. 2B) folds or wraps a fold portion 148a of the redistribution connection layer 142 around a right side edge 150a of the first die 140a (FIG. 3B). As shown on FIG. 3C, the attachment tool 146 then traverses along a back side 144b of the first die 140a to press and attach the entire side A of the redistribution connection layer 142 along the front and back sides 144a and 144b of the first die 140a.

Figure 3D:
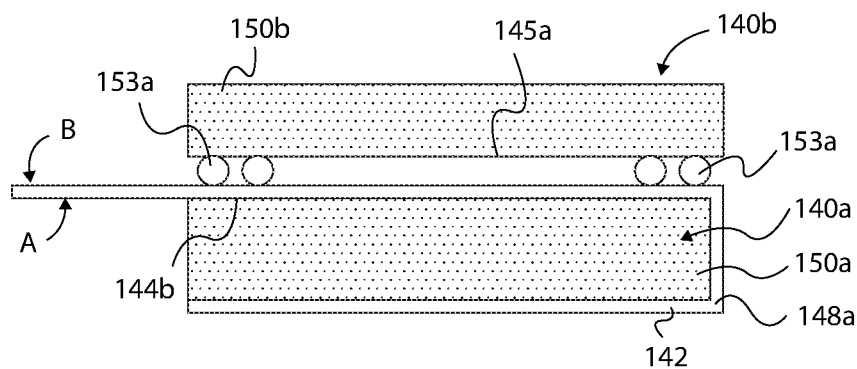
Figure 3E:
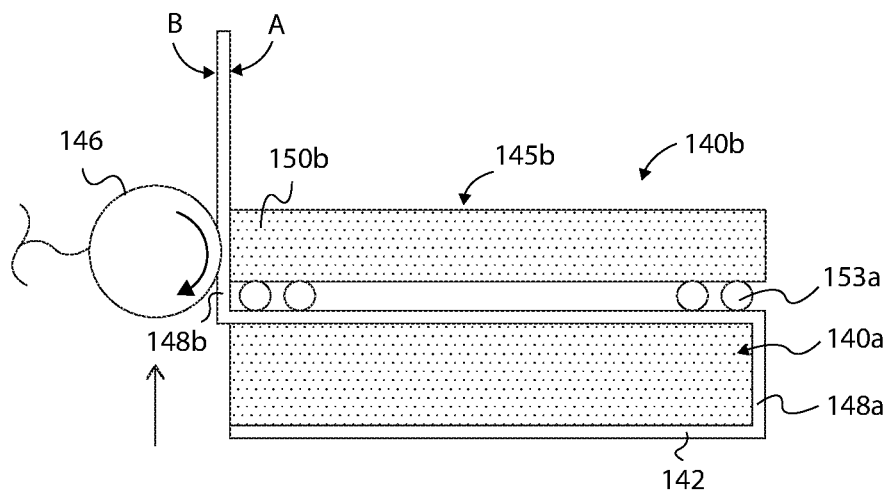
Figure 3F:
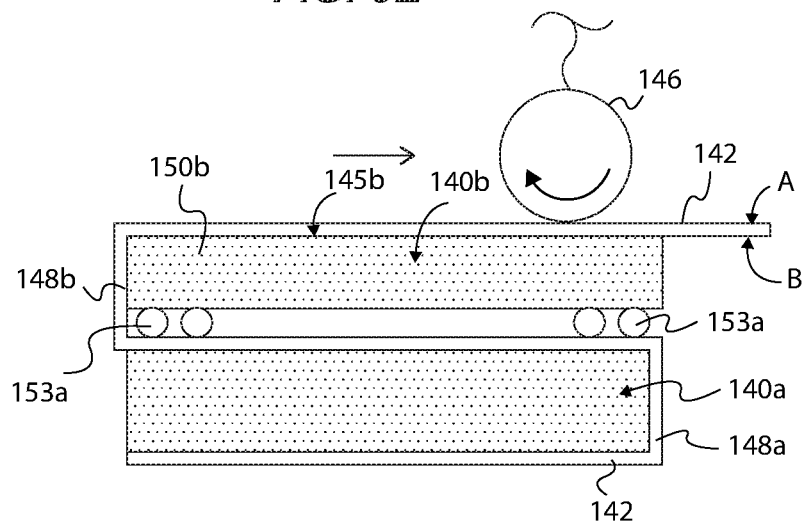

As shown on FIG. 3D, a second die 140b can be stacked on the first die 140a. Specifically, a front side 145a of the second die 140b is attached to side B of the redistribution connection layer 142, via solder components 153a adjacent the back side 144b of the first die 140a. Thus, a length of the connection layer 142 is disposed between the first and second dies 140a and 140b as extending from a length along the back side 144b of the first die 140a. The second die 140b can be thermally bonded to side B of the redistribution connection layer 142 via solder components 153a. As shown on FIG. 3E, the attachment tool 146 folds or wraps a fold portion 148b of the redistribution connection layer 142 around a left side edge 150b of the second die 140b. As shown on FIG. 3F, the attachment tool 146 then traverses along a back side 145b of the second die 140b to press and attach the entire side B of the redistribution connection layer 142 along the back side 145b the second die 140b.

Figure 3G:
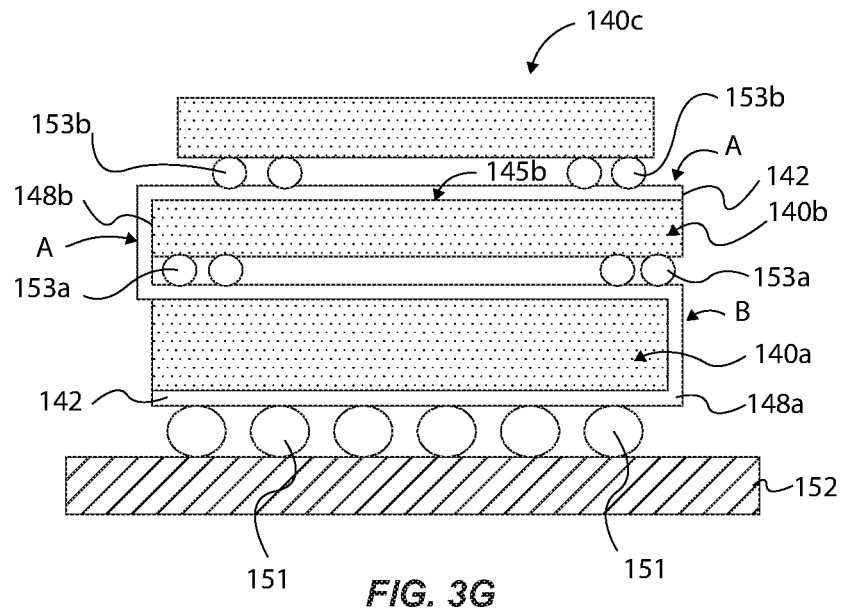

As shown on FIG. 3G, a third die 140c can be stacked on the second die 140b. Specifically, the third die 140c can be attached to side A of the redistribution connection layer 142, via solder components 153b, adjacent the back side 145b of the second die 140b. Thus, a length of the connection layer 142 is disposed between the second and third dies 140b and 140c. The third die 140c can be thermally bonded to side A of the redistribution connection layer 142 via solder components 153b. As shown on FIG. 3G, the redistribution connection layer 142 "serpentines" between and around sides of the dies, thereby eliminating the need for TSVs, TMVs, and other vertical interconnects. Such serpentine redistribution connection layer 142 can continue a similar pattern for any number of stacked dies onto the third die 140c, for instance.

Solder components 151 can be attached along respective contact pads (e.g., FIG. 1A) along side B of the redistribution connection layer 142 adjacent the first die 140a, and then the solder components 151 can be electrically and mechanically attached to an electronics component 152. Therefore, each of the dies 140a-c can be electrically coupled to one another (any combination) and/or to the electronics component 152 via the one strip of flexible redistribution connection layer 140.

Figure 4:
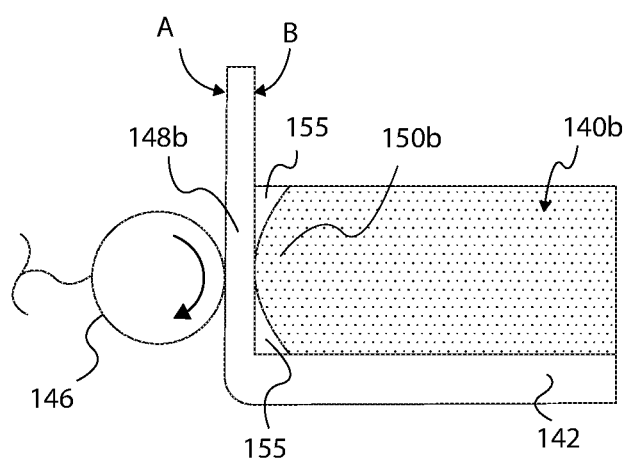
FIG. 4 illustrates a schematic side plan view of a redistribution connection layer folded or wrapped around a side edge of a die in accordance with an example embodiment.

FIG. 4 illustrates a schematic side plan view of a redistribution connection layer 142, for example, folded or wrapped around the left side edge 150b of the second die 140b (or any die herein) in accordance with one example of the present disclosure. The side edge 150b can be rounded (or trimmed/chamfered) by a laser or saw, for example, about upper and lower corners of the die 140b to avoid stress or damage to the connection layer 142 when wrapped around. A buffer material 155 (e.g., dielectric support material) can be disposed between the side edge 150b and fold portion 148b of the redistribution connection layer 142. The buffer material 155 can be deposited to the side edge 150bs before attachment of the redistribution connection layer 142 to provide lateral support to the redistribution connection layer 142 to prevent cracking or failure about the fold portion. This configuration can exist on any side edge of any die discussed herein.

Figure 5A:
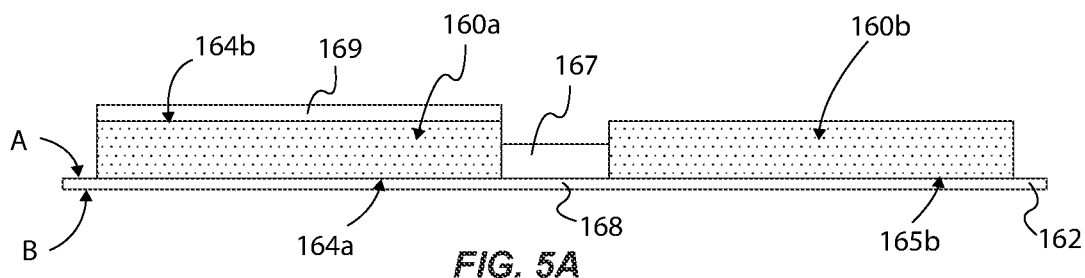
FIGS. 5A-5D illustrate various schematic side plan views of methods of attaching dies with a redistribution connection layer in accordance with an example embodiment.
Figure 5B:
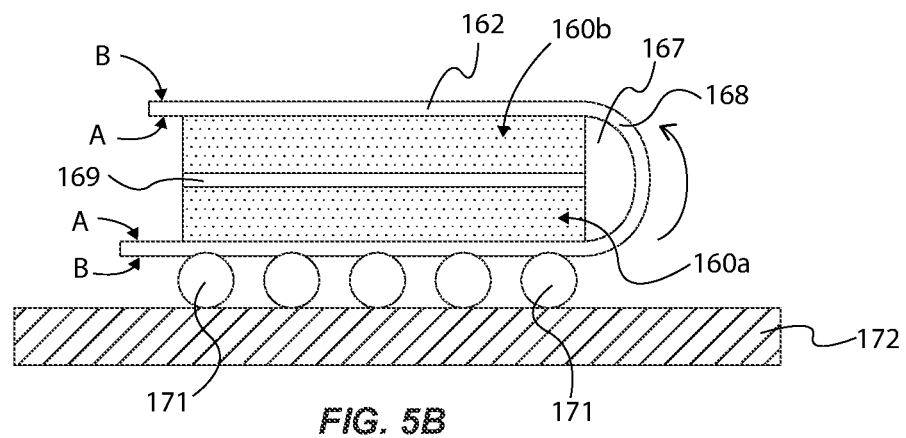

FIGS. 5A and 5B illustrate a method of attaching dies with a redistribution connection layer in accordance with one example of the present disclosure. Specifically as shown on FIG. 5A, a first die 160a and a second die 160b are attached to a redistribution layer 162 along front sides 164a and 165a, respectively. The first and second dies 160a and 160b are laterally separated from each other along side A by a fold portion 168 of the redistribution connection layer 162. A support material 167 can be disposed between ends of the first and second dies 160a and 160b. An adhesive layer 169 can be deposited along a back side 164b of the first die 160a. As shown on FIG. 5B, the second die 160b is folded (e.g., rotated/revolved) by a mechanism (e.g., 146, FIG. 4) toward the first die 160b (as illustrated by the rotational arrow), and then attached to the first die 160a via the adhesive layer 169. Therefore, the fold portion 168 can comprise a curved portion between a first lateral length (along first die 160a) of the connection layer 162 and a second lateral length (along second die 160b) of the connection layer 162. Thus, the support material 167 (e.g., a dielectric curable epoxy), provides rigidity about the curved fold portion 168 to prevent cracking of the connection layer 162.

In one aspect, solder components 171 can be attached along respective contact pads (e.g., FIG. 1A) along side B of the redistribution connection layer 162 adjacent the first die 160a, and then the solder components 171 can be electrically and mechanically attached to an electronics component 172. Therefore, each of the dies 160a and 160b can be electrically coupled to one another and/or to the electronics component 172 via one strip of flexible redistribution connection layer 162.

Figure 5C:
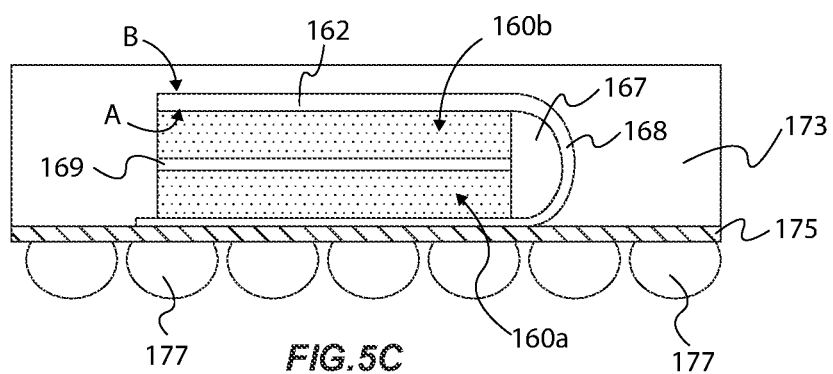

Alternatively, as shown on FIG. 5C, in one aspect the "wrapped" first and second dies 160a and 160b can be encapsulated with an encapsulate material 173 and attached to a redistribution layer 175 having solder components 177. Such redistribution layer 175 can already be formed onto a stack of dies, or it can be similar to the connection layer 162 for attachment to an electronics component.

Figure 5D:
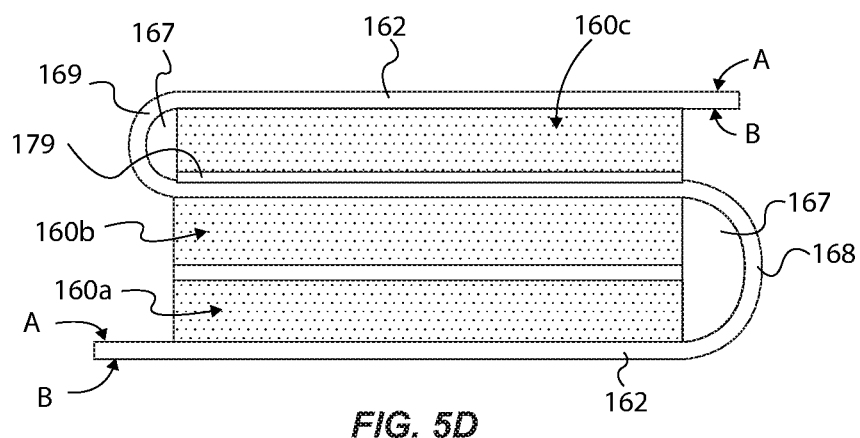

As shown on FIG. 5D, in one aspect a third die 160c can be attached to side B of the redistribution connection layer 162 via an adhesive layer 179 adjacent the second die 160b. The third die 160c is folded (e.g., rotated/revolved) by a mechanism (not shown) toward the second die 160b, and then attached to the second die 160b via the adhesive layer 179. Therefore, a fold portion 169 is formed and can comprise a curved portion between a third lateral length (along second die 160b) of the connection layer 162 and a fourth lateral length (along third die 160c) of the connection layer 162. A support material 167 (e.g., a dielectric curable epoxy) can be deposed about the fold portion 169 adjacent the third die 160c to provide rigidity about the curved fold portion 169 to prevent cracking of the connection layer 162. The resulting package of FIG. 5D can be attached to an electronics component (e.g., as in FIGS. 5B and/or 5C).

Figure 6A:
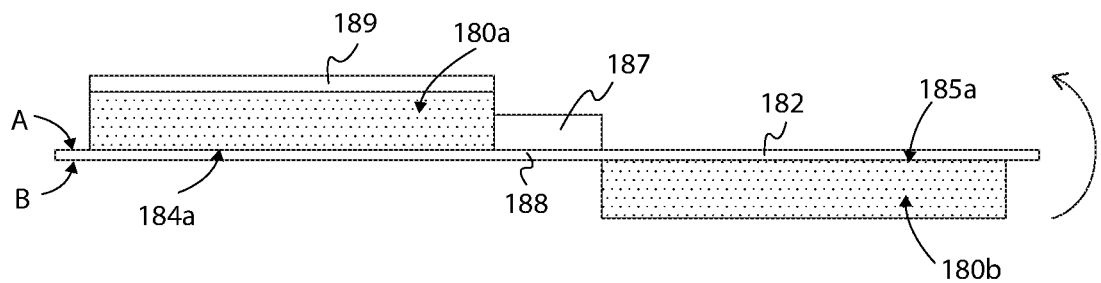
FIGS. 6A-6B illustrate various schematic side plan views of methods of attaching dies with a redistribution connection layer in accordance with an example embodiment.
Figure 6B:
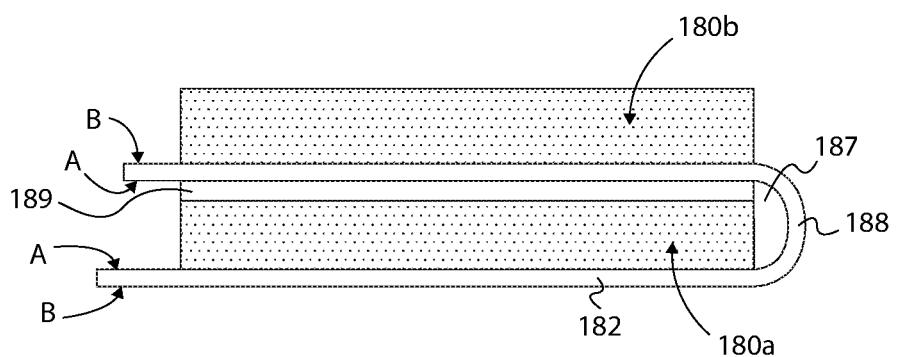

FIGS. 6A and 6B illustrate a method of attaching dies with a redistribution connection layer in accordance with one example of the present disclosure. Specifically as shown on FIG. 6A, a first die 180a and a second die 180b are attached to a redistribution layer 182 along their respective front sides 184a and 185a. The first and second dies 180a and 180b are laterally separated from each other such that the first die 180a is attached along side A of the redistribution connection layer 182 and the second die 180b is attached along side B. Thus, the first and second dies 180a and 180b are separated about a fold portion 188 of the redistribution connection layer 182. A support material 187 can be disposed between ends of the first and second dies 180a and 180b, and adjacent the first die 180a along side A. An adhesive layer 189 can be deposited along a back side 184b of the first die 180a.

As shown on FIG. 6B, the second die 180b is folded (e.g., rotated/revolved) by a mechanism (not shown) toward the first die 180a (as illustrated by the rotational arrow), and then attached to the first die 180a via the adhesive layer 189. Therefore, the fold portion 188 can comprise a curved portion between a first lateral length (along die 180a) of the redistribution connection layer 182 and a second lateral length (along die 180b) of the redistribution connection layer 182. Thus, the support material 187 (e.g., a dielectric curable epoxy), provides rigidity about the curved fold portion 188 to prevent cracking of the connection layer 182. Similarly to FIG. 5B, solder components can be disposed along the exposed side B of the redistribution connection layer 182, and then electrically and mechanically attached to an electronics component. Therefore, each of the dies 180a and 180b can be electrically coupled to one another and/or to an electronics component via one strip of flexible redistribution connection layer 182.

Figure 7A:
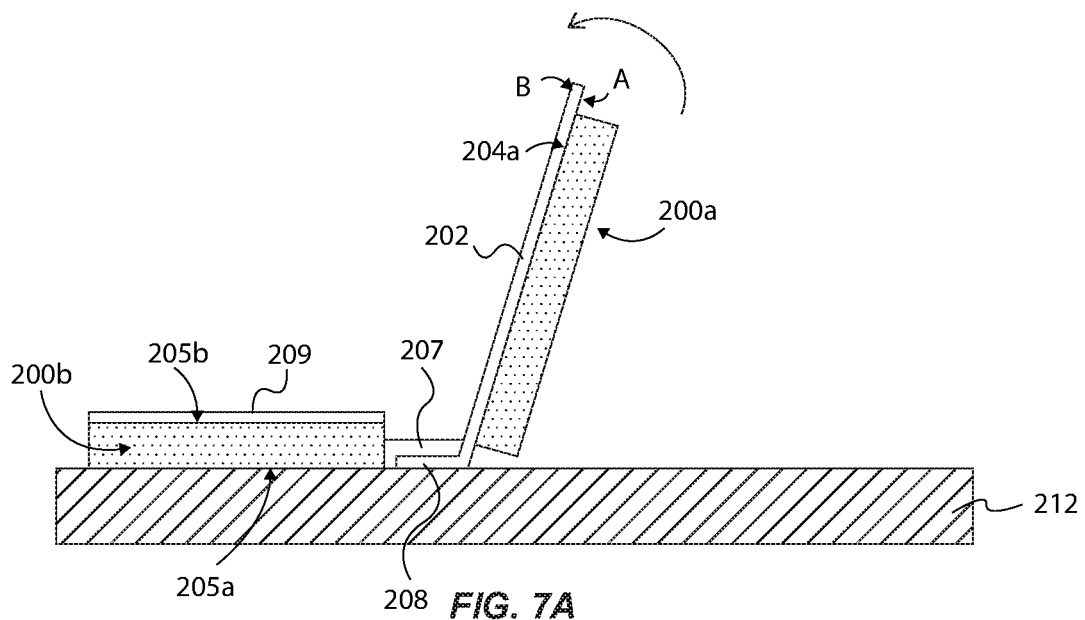
FIGS. 7A-7C illustrate a schematic side plan view of a method of forming an electronics package device with dies attached via a redistribution connection layer in accordance with an example embodiment.
Figure 7B:
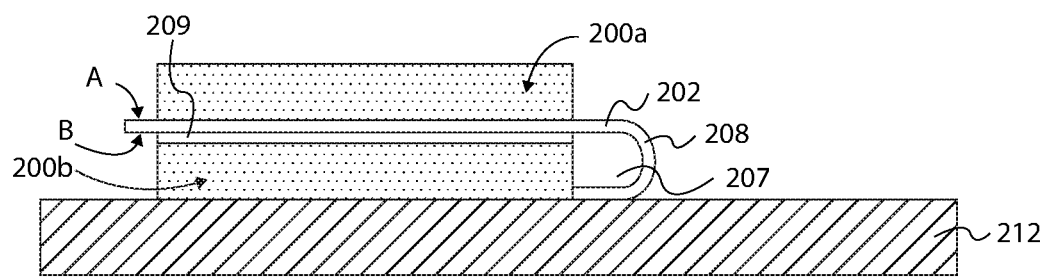
Figure 7C:
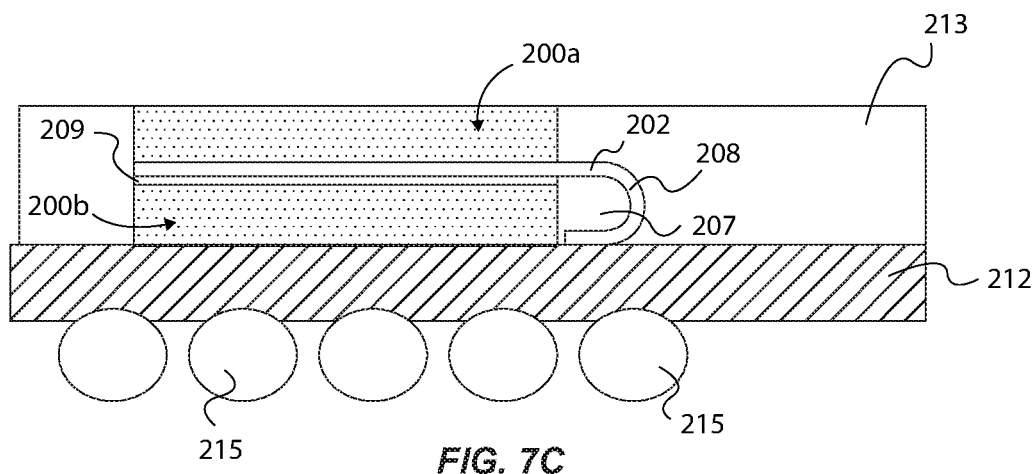

FIGS. 7A-7C illustrates a method of attaching a die to an electronics component via a redistribution connection layer in accordance with one example of the present disclosure. Specifically as shown on FIG. 7A, a first die 200a is attached to a redistribution connection layer 202 along side A and a front side 204a of the first die 200a. A second die 200b is attached to an electronics component 212 via a front side 205a of the second die 200b. Then, an end fold portion 208 of the redistribution connection layer 202 is attached to an electronics component 212 (e.g., a substrate) along a portion of side A of the connection layer 202. A support material 207 can be deposited adjacent the second die 200b along a section of side B of the connection layer 202 and to a portion of the electronics component 212 adjacent the second die 200b. An adhesive layer 209 can be deposited along a back side 205b of the second die 200b.

As shown on FIG. 7B, the first die 200a is folded (e.g., rotated/revolved) by a mechanism (not shown) toward the second die 200b (as illustrated by the arrow of 7A), and then side B of the redistribution connection layer 202 is attached to the second die 200b via the adhesive layer 209. Therefore, the end fold portion 208 can comprise a curved portion between a first lateral length (along first die 200a) of the redistribution connection layer 202 and the electronics component 212. Thus, the support material 207 (e.g., a dielectric curable epoxy), provides rigidity about the curved end fold portion 208 to prevent cracking of the connection layer 202. As described in other examples, a third die could be stacked to the second die 200b and the redistribution connection layer 202 can be folded and attached to the third die (e.g., similar to FIG. 5D).

As shown on FIG. 7C, in one aspect the attached first and second dies 200a and 200b can be encapsulated with an encapsulate material 213, and solder components 215 can be disposed along the electronics component 212 for attachment to an electronics assembly, for instance.

Figure 8:
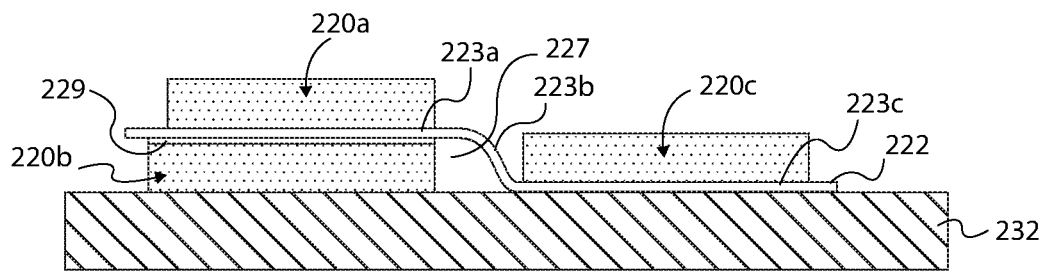
FIG. 8 illustrates a schematic side plan view of dies attached via a redistribution connection layer in accordance with an example embodiment.
Figure 9:
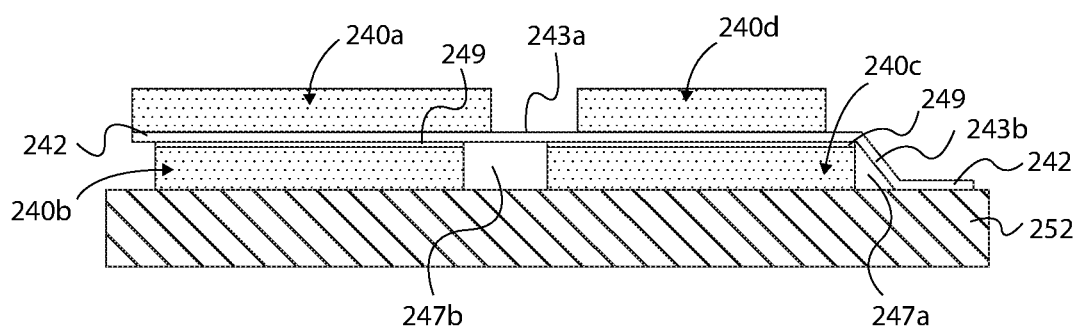
FIG. 9 illustrates a schematic side plan view of dies attached via a redistribution connection layer in accordance with an example embodiment.
Figure 10:
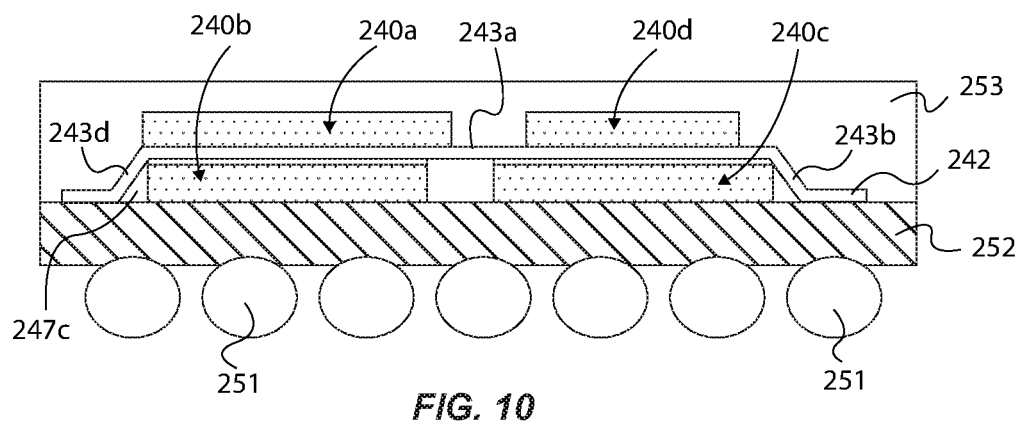
FIG. 10 illustrates a schematic side plan view of dies attached via a redistribution connection layer in accordance with an example embodiment.

FIGS. 8-10 illustrate a variety of devices and method of making such devices in accordance with examples of the present disclosure.

In one example, FIG. 8 shows an electronics package device comprising a first die 220a, a second die 220b, and a third die 220c that are supported by an electronics component 232. A redistribution connection layer 222 is disposed between the first die 220a and the second die 220b. The second die 220b is flipped (i.e., attached/bonded to the electronics component 232) and an adhesive layer 229 is disposed between the redistribution connection layer 222 and the first die 220a. The first die 220a is stacked to the second die 220b such that a first length 223a of the redistribution connection layer 222 is disposed there between. From the first length 223a, a fold portion 223b extends vertically (e.g., curved or linearly downwardly) to a second length 223c that is attached to the electronics component 232 and to the third die 220c. A support material 227 can disposed adjacent the second die 220b and the fold portion 223b for structural support of the redistribution connection layer 222. Therefore, the first die 220a is electrically coupled to the electronics component 232 via one strip of flexible redistribution connection layer 222. Additional redistribution connection layers can be attached, as well as other dies, in any manner and method of any of the additional example(s) discussed herein.

In one example, FIG. 9 shows an electronics package device comprising a first die 240a, a second die 240b, a third die 240c, and a fourth die 240d that are supported by an electronics component 252. A redistribution connection layer 242 is disposed between the first die 240a and the second die 240b. The second die 240b and third die 240c are flipped (i.e., attached/bonded to the electronics component 252) and an adhesive layer 249 can be disposed between the redistribution connection layer 242 and each of the first die 240a and the third die 240c. The first die 240a is stacked to the second die 240b, and the fourth die 240d is stacked to the third die 240c, such that a first length 243a of the redistribution connection layer 242 is disposed between each respective stacks of dies. From the laterally disposed first length 243a, a first fold portion 243b extends vertically (e.g., downwardly) to the electronics component 232 where it is attached to a right portion of the electronics component 232. A first support material 247a can disposed adjacent the third die 240c and the first fold portion 243b for rigid support, and a second support material 247b can be disposed between the second and third dies 240b and 240c. Therefore, the first die 240a and the fourth die 240d are each electrically coupled to the electronics component 252 via one strip of flexible redistribution connection layer 242. Additional redistribution connection layers can be attached, as well as other dies, in any manner and method of any of the additional example(s) discussed herein.

In one example, FIG. 10 shows an electronics package device similar to that of FIG. 9. One notable difference is a second fold portion 243d extends vertically (e.g., downwardly) to the electronics component 232 where it is attached to a left portion of the electronics component 232 (opposite the first fold portion 243b). A third support material 247c can be disposed adjacent the second die 240b and the second fold portion 243d for rigid support. An encapsulate material 253 can be deposited about the dies 240a-d and the redistribution connection layer 242 to encase the device, and solder components 251 can be distributed along the electronics component 252 for attachment to an electronics assembly, for instance.

Figure 11A:
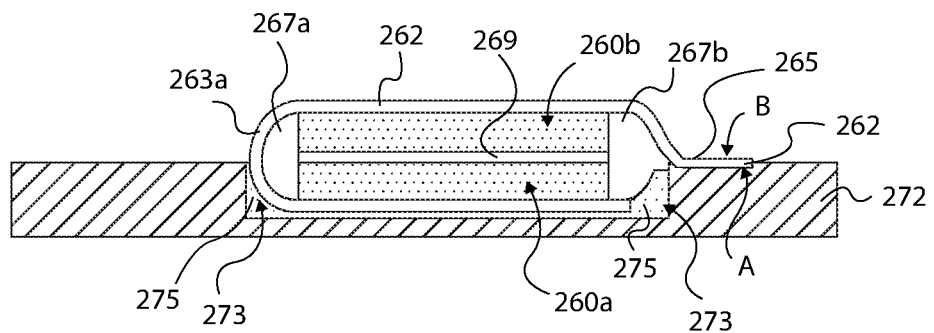
FIGS. 11A and 11B illustrate a schematic side plan view of a method of forming an electronics package device with dies attached via a redistribution connection layer in accordance with an example embodiment.
Figure 11B:
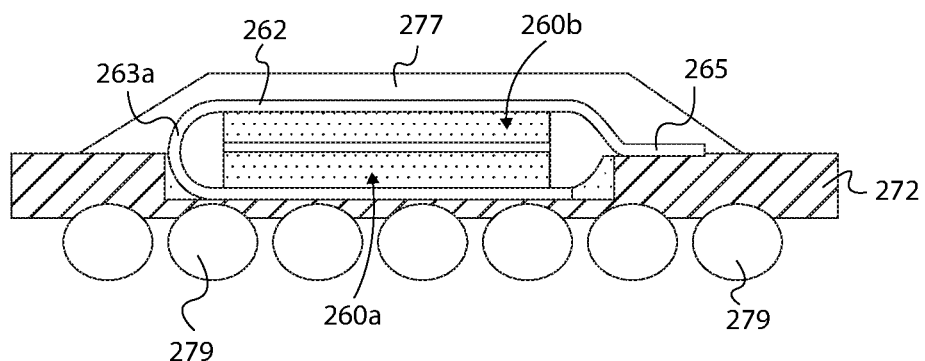

FIGS. 11A and 11B illustrate a schematic side plan view of an electronics package device in accordance with one example of the present disclosure. Specifically, and similar to the method and device regarding FIG. 5A, a first die 260a and a second die 260b are attached to a redistribution layer 262 along their front sides. As similarly shown on FIG. 5A, the first and second dies 260a and 260b are first laterally separated from each other along (a flattened) side A by a first fold portion 263a of the redistribution connection layer 262. A first support material 267a can be disposed between ends of the first and second dies 260a and 260b, and a second support material 267b can be deposited adjacent the first die 260a and to the redistribution connection layer 262. An adhesive layer 269 can be deposited along a back side of the first die 260a. As similarly shown on FIG. 5B, the second die 260a is folded (e.g., rotated/revolved) by a mechanism (not shown) toward the first die 260b, and then attached to the first die 260a via the adhesive layer 269. This forms the wrapped first and second dies 260a and 260b of FIG. 11A (wrapped by the redistribution connection layer 262 before being attached to the substrate 272).

Once the first and second dies 260a and 260b are "wrapped" and attached to each other via the redistribution connection layer 262, an attachment end 265 of the redistribution connection layer 262 is attached to the electronics component 272 (substrate) along a portion of side A. Thus, side A of the redistribution connection layer 262 electrically couples the electronics component 272 to each of the first and second dies 260a and 260b. The "wrapped" first and second dies 260a and 260b can then be secured into a cavity 273 of the electronics component 272 and supported by a mold compound 275, such as an epoxy. As shown on FIG. 11B, an encapsulate material 277 can be deposited about the dies 260a and 260b (and the redistribution connection layer 262) to encase the electronics package device, and solder components 279 can be distributed along the electronics component 272 for attachment to an electronics assembly, for instance. Such architecture minimizes a z-height of the device because at least a portion of at least one die is disposed below a planar surface of a substrate, for instance.

Figure 12:
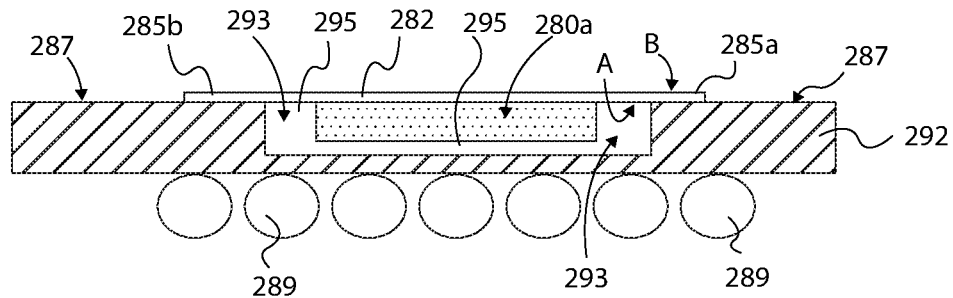
FIG. 12 illustrates a schematic side plan view of a die attached to a substrate via a redistribution connection layer in accordance with an example embodiment.

FIG. 12 illustrates a schematic side plan view of a die attached to a substrate via a redistribution connection layer in accordance with one example of the present disclosure. Specifically, a first die 280a is attached to side A of a redistribution connection layer 282 along a front side of the first die 280a. The first die 280a is disposed in a cavity 293 of an electronics component 292, and ends 285a and 285b of the redistribution connection layer 282 are attached to a planar surface 287 of the electronics component 292. This configuration electrically couples the first die 280a to the electronics component 292 via only side A of the redistribution connection layer 282. A mold compound 295 can deposited about the cavity 293 to support the first die 280a and the redistribution connection layer 282. Additional electronics devices (die, integrated passives, etc.) can be attached to side B of the redistribution connection layer 282, and the entire device can be encapsulated. Solder components 289 are distributed along the electronics component 292 for attachment to an electronics assembly, for instance. Such architecture minimizes a z-height of the device because at least a portion of at least one die is disposed below the planar surface 287 of the substrate, for example.

Figure 13:
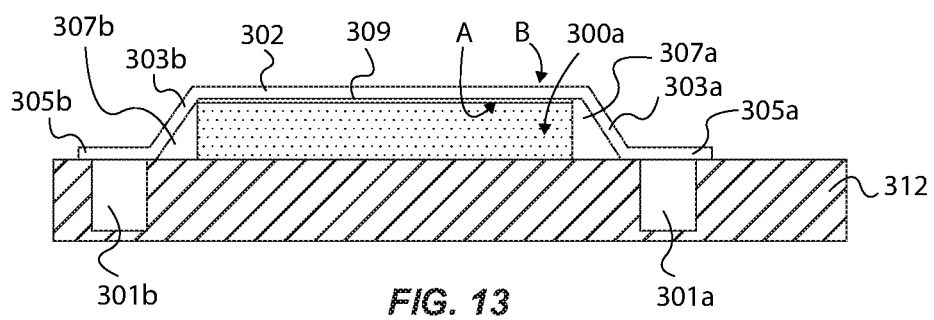
FIG. 13 illustrates a schematic side plan view of a die attached to a substrate via a redistribution connection layer as a heat pipe in accordance with an example embodiment.

FIG. 13 illustrates a schematic side plan view of an electronics package device in accordance with one example of the present disclosure. A first die 300a is attached to the electronics component 312 along a front side of the first die 300a. An adhesive layer 309 can be deposited along a back side of the first die 300a. Side A of a redistribution connection layer 302 is attached along the adhesive layer, and end portions 305a and 305b of the redistribution connection layer 302 are each attached to respective heat sink devices 301a and 301b disposed within or supported by the electronics component 312. First and second fold portions 303a and 303b each extend from the back side of the first die 300a downwardly (and transverse) toward the respective end portions 305a and 305b that are attached to the heat sink devices 301a and 301b. First and second support materials 307a and 307b can be deposited adjacent respective fold portions 303a and 303b, and adjacent respective ends of the first die 300a, for support to the fold portions 303a and 303b. Thus, the redistribution connection layer 302 acts as a heat pipe for drawing heat away from the first die 300a (or other stacked component) to the heat sink devices 301a and 301b and then distributed throughout the electronics component 312. Additional electronics components (dies, integrated passives, heat sinks, etc.) can be attached to the top of the redistribution connection layer 302, and then encapsulated.

Figure 14:
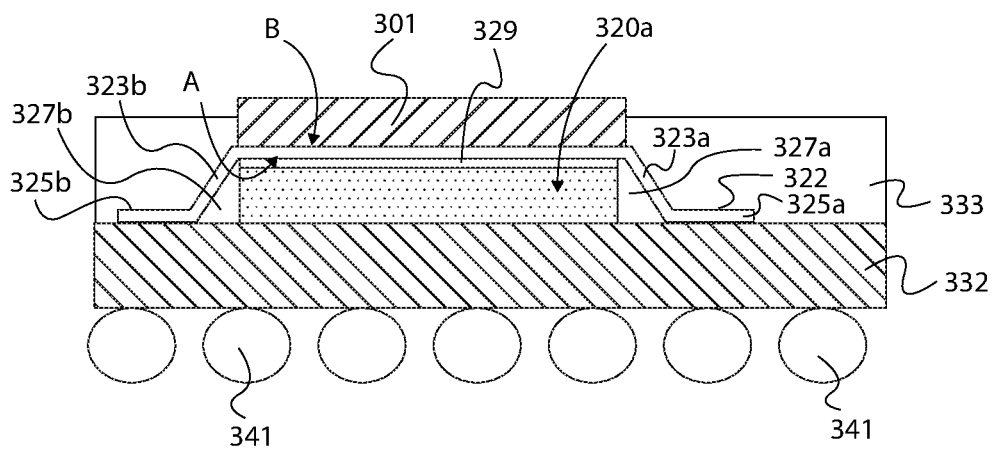
FIG. 14 illustrates a schematic side plan view of an electronics package device having a redistribution connection layer and a heatsink in accordance with an example embodiment.

FIG. 14 illustrates a schematic side plan view of an electronics package device in accordance with one example of the present disclosure. A first die 320a is attached to the electronics component 332 along a front side of the first die 320a. An adhesive layer 329 can be deposited along a back side of the first die 320a. Side A of a redistribution connection layer 322 is attached along the adhesive layer, and end portions 325a and 325b of the redistribution connection layer 322 are each attached to respective attachment portions on the electronics component 332. First and second fold portions 323a and 323b each extend from the back side downwardly (and transverse) to the respective attachment points on the electronics component 332. First and second support materials 327a and 327b can be deposited adjacent respective fold portions 323a and 323b, and adjacent respective ends of the first die 300a, for support to the fold portions 323a and 323b. A heat sink 301 can be attached to side B of the redistribution connection layer 322 (and even attached to contact pads of the redistribution connection layer 322) for drawing heat away from the first die 320a then distributed to the ambient environment (or to another substrate or component, for instance). An encapsulate material 333 can be deposited around the first die 320a, the redistribution connection layer 322, and a lower portion of the heat sink 301, such that a top portion of the heat sink 301 is exposed to the environment to act as a heat transfer device. Solder components 341 can be distributed along the electronics component 332 for attachment to an electronics assembly, for instance.

Figure 15A:
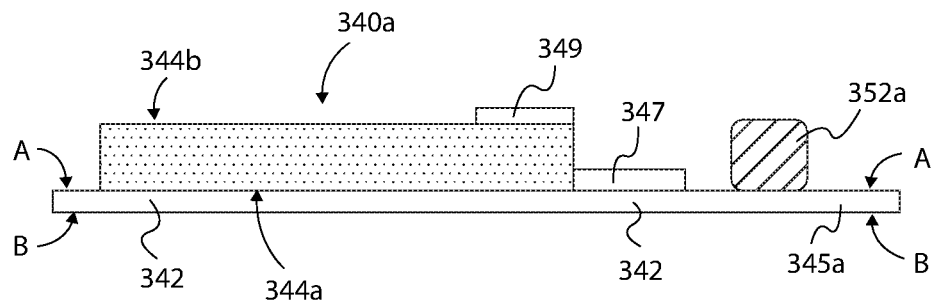
FIGS. 15A-15C illustrate a schematic side plan view of a method of forming an electronics package device in accordance with an example embodiment.
Figure 15B:
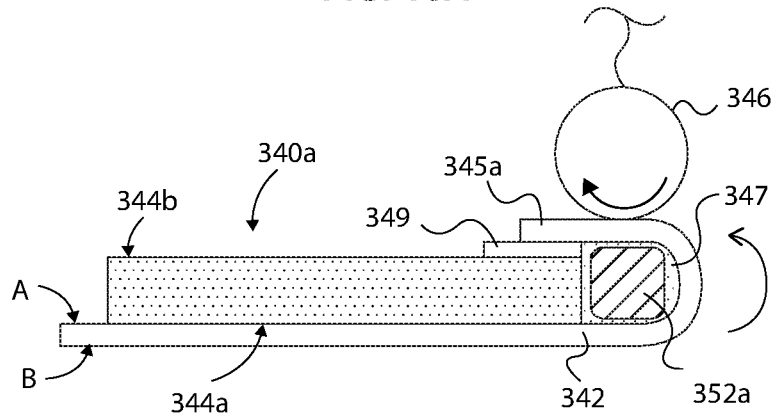
Figure 15C:
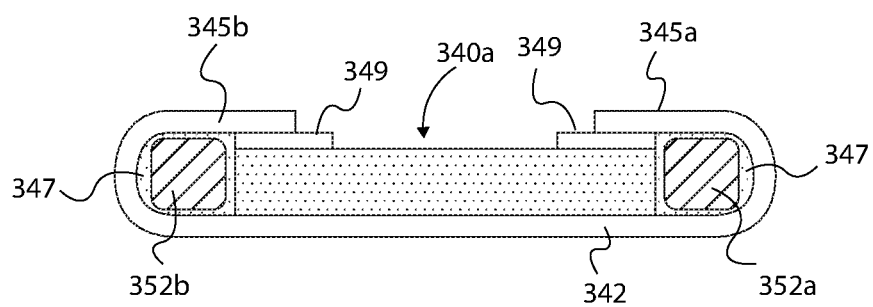

FIGS. 15A-15C illustrate a schematic side plan view of a method of forming an electronics package device in accordance with one example of the present disclosure. Specifically, a first die 340a is attached to side A of a redistribution connection layer 342 along a front side 344a of the first die 340a. In this example, a first electronics component 352a (such as an integrated passive device) is attached to side A of the redistribution connection layer 342 proximate the first die 340a. A support material 347 is deposited adjacent the first die 340a and along side A of the redistribution connection layer 342. An adhesive layer 349 can be deposited to a portion of a backside of the first die 340a. As shown on FIG. 15B, the first electronics component 352a is folded (e.g., rotated/revolved) by a mechanism 346 (e.g., rubber wheel) toward the first die 340a (as illustrated by the arrow of FIG. 15A). An end portion 345a of the redistribution connection layer 342 is then attached to the first die 340a via the adhesive layer 349, which isolates the redistribution connection layer 342 from the back side 344b of the first die 340a. Thus, the first electronics component 352a is disposed adjacent a side edge of the first die 340a. This process can be repeated for a second electronics component 352b on the other end of the first die 340a (FIG. 15C). Therefore, each of the first and second electronics components 352a and 352b (attached to side A of the redistribution connection layer 342) can be electrically coupled to another component attached to side B of the redistribution connection layer 342 (such as a substrate, die, or other electronics component) (e.g., FIG. 16C). Thus, TSVs or TMVs are not required to electrically couple integrated passive devices, for instance, to other electronics components. The resulting package device of FIG. 15C can then be attached/bonded to a substrate via solder components, for instance (e.g., FIG. 16C). Third and fourth such integrated passive devices can be disposed adjacent the other side edges (not shown) of the first die 340a in a similar manner.

Figure 16A:
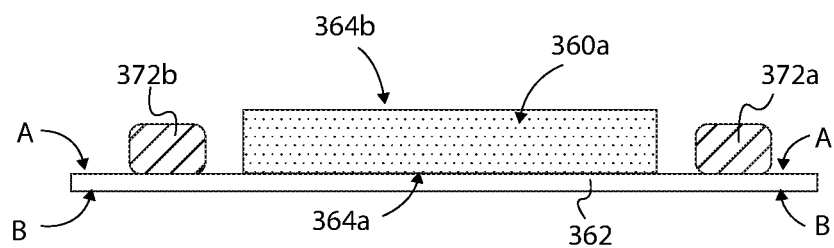
FIGS. 16A-16C illustrate a schematic side plan view of a method of forming an electronics package device in accordance with an example embodiment.
Figure 16B:
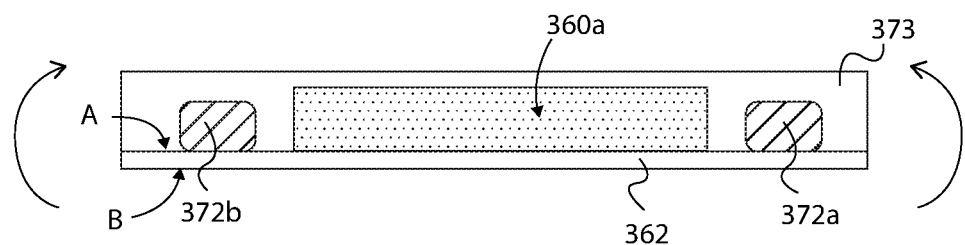

FIGS. 16A and 16B illustrate a schematic side plan view of a method of forming an electronics package device in accordance with one example of the present disclosure. Specifically (and similarly to FIGS. 15A and 15B) a first die 360a is attached to side A of a redistribution connection layer 362 along a front side 364a of the first die 360a. In this example, first and second electronics components 372a and 372b (such as integrated passive devices) are attached to side A of the redistribution connection layer 362 on either sides of the first die 360a. A mold compound 373 can be deposited to encase the first die 340a, the first and second electronics components 372a and 372b, and along side A of the redistribution connection layer 362. The sides of the redistribution connection layer 362 can be folded to encase the first and second electronics components 372a and 372b, similar to FIG. 15C). The resulting wrapped package device can be attached to another electronics component (e.g., die, substrate, etc.).

Figure 16C:
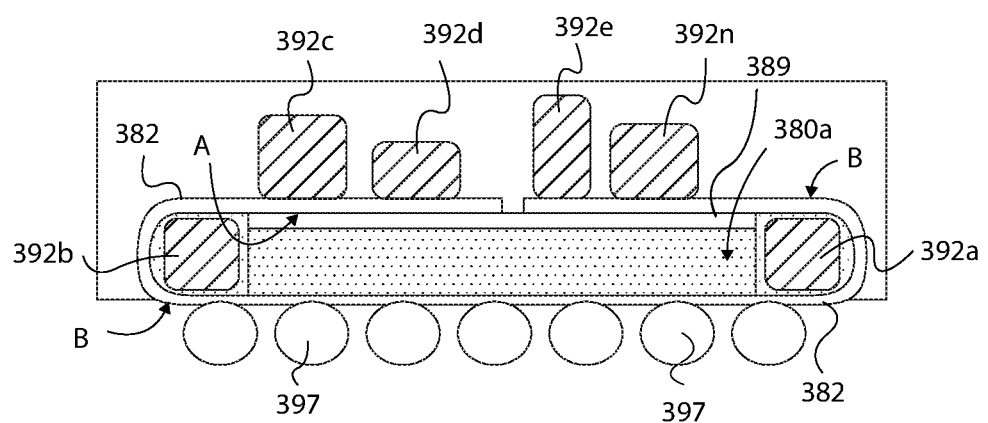

FIG. 16C shows another example (similar to FIG. 15C) of a schematic side plan view of a method of forming an electronics package device in accordance with one example of the present disclosure. Specifically (and similarly to FIGS. 15A and 15B) a first die 380a is attached to side A of a redistribution connection layer 382 along a front side of the first die 380a. In this example, first and second electronics components 392a and 392b (such as integrated passive devices) are attached to side A of the redistribution connection layer 382 on either sides of the first die 380a. An adhesive layer 369 can be disposed along a back side of the first die 380a. Similarly as discussed regarding FIG. 15B, the first and second electronics components 392a and 392b are each folded (e.g., rotated/revolved) inwardly by mechanisms (e.g., rubber wheel) toward each other and adjacent ends of the first die 380a. End portions of the redistribution connection layer 362 are each attached to the first die 380a via the adhesive layer 389, which isolates the redistribution connection layer 382 from the back side of the first die 360a. Then, a plurality of electronics components 392c-n can be attached to side B of the redistribution connection layer 382. Solder components 397 can be disposed along side B of the redistribution connection layer 382 and attached to another electronics component, such as a substrate or electronics assembly. Thus, TSVs or TMVs are not required to electrically couple integrated passive devices, for instance, to die(s) and other electronics components.

Figure 17:
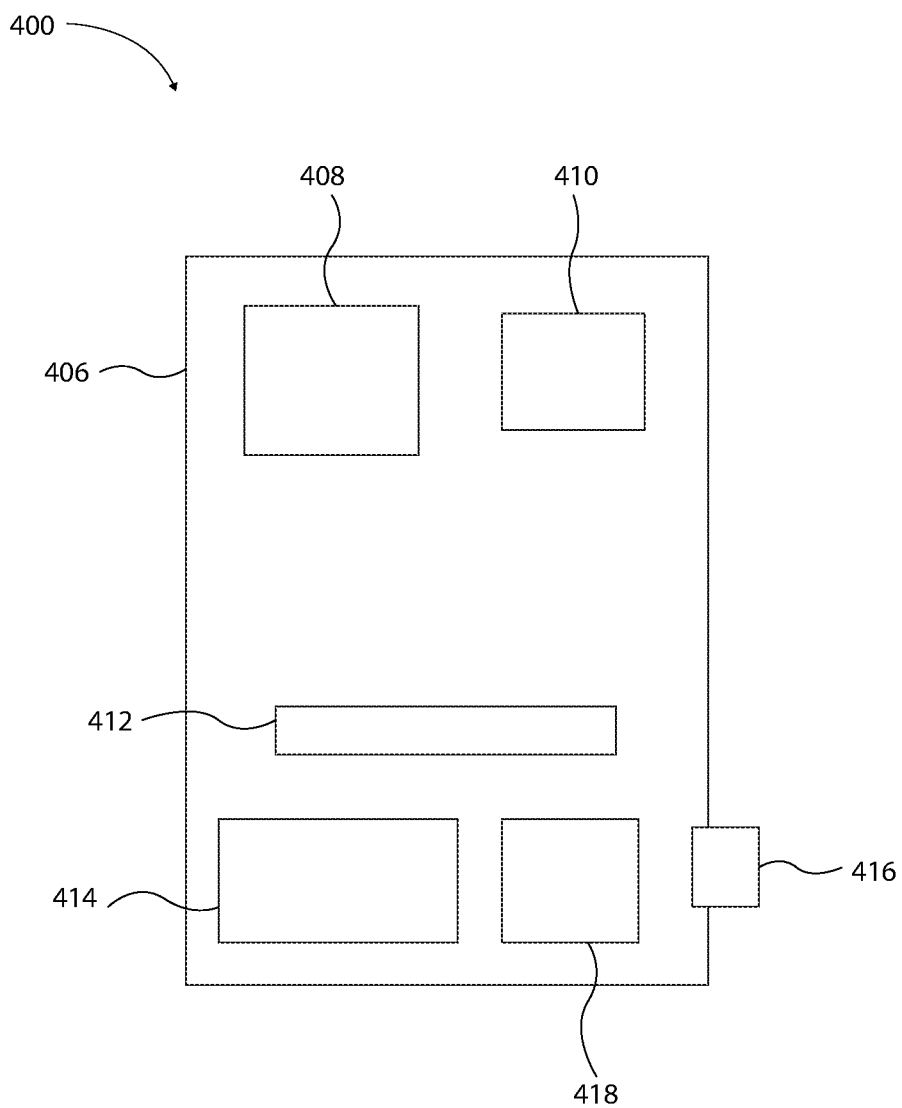
FIG. 17 illustrates a plan view of a system having an electrical connector in accordance with an example embodiment.

FIG. 17 illustrates an example computing system 400. The computing system 400 can include a package device 408 having at least one die (e.g., 00s of FIGS. 1A-16C) attached to an electronics component (e.g., substrate, electronics assembly, integrated passive device, etc., as discussed herein) via a redistribution connection layer ('02s of FIGS. 1A-16C) as disclosed herein, coupled to a motherboard 406. In one aspect, the computing system 400 can also include a processor 410, a memory device 412, a radio 418, a heat sink 414, a port 416, a slot, or any other suitable device or component, which can be operably coupled to the motherboard 406. The computing system 400 can comprise any type of computing system, such as a desktop computer, a laptop computer, a tablet computer, a smartphone, a server, etc. Other embodiments need not include all of the features specified in FIG. 17, and may include alternative features not specified in FIG. 17.

EXAMPLES

The following examples pertain to further embodiments.

In one example there is provided an electronics device comprising: an electronics component; a first die; and a separately formed connection layer comprising: a first dielectric layer; a second dielectric layer; and at least one redistribution layer disposed between the first and second dielectric layers and electrically coupling the first die to the electronics component.

In one example, the first dielectric layer comprises first opening that exposes a first redistribution layer (RDL) pad of the at least one redistribution layer, and comprises a second opening that exposes a second RDL pad of the at least one redistribution layer, wherein a first solder component electrically couples the first RDL pad to the first die, and wherein a second solder component electrically couples the second RDL pad to the electronics component.

In one example, the separately formed connection layer is attached to the first die along a first direction, wherein the separately formed connection layer extends from the first die in a second direction transverse to the first direction, such that the separately formed connection layer is flexible.

In one example, a portion of the separately formed connection layer is curved from the first die to the electronics component.

In one example, wherein the separately formed connection layer comprises a fold portion that extends from the first die to the electronics component.

In one example, the electronics device further comprises a second die having an front side attached to the first dielectric layer and a back side attached to the first die, such that a first length of the separately formed connection layer is substantially parallel to a second length of the separately formed connection layer, wherein a curved length of the separately formed connection layer extends between the first and second lengths.

In one example, the electronics device further comprises an adhesive layer disposed between the first and second dies, and a support material disposed between the curved length and ends of the first and second die.

In one example, the electronics device further comprises a redistribution layer attached to the second dielectric layer and comprising an encapsulate material encasing the first and second dies and the separately formed connection layer above the redistribution layer.

In one example, the electronics device further comprises a second die disposed between the electronics component and the first die such that a front side of the second die is attached to the electronics component, wherein a first length of the separately formed connection layer is disposed between the first and second dies, and wherein a curved length of the separately formed connection layer extends from the first length to the attached electronics component.

In one example, the electronics device further comprises an adhesive layer disposed between the second die and the separately formed connection layer, and a support material disposed between the curved length and an end of the second die.

In one example, the electronics device further comprises a mold compound that encases the first and second dies and the separately formed connection layer, and wherein the electronics component comprises a substrate supporting the first and second dies and having lower solder components for attachment to an electronics assembly.

In one example, the electronics device further comprises a second die disposed between the electronics component and the first die such that a front side of the second die is attached to the separately formed connection layer, wherein one end of the separately formed connection layer is attached to the electronics component and the other end is attached to a front side of the second die such that the separately formed connection layer is attached along a front side of the first die and the front side of the second die.

In one example, the electronics device further comprises a mold compound that encases the first and second dies and the separately formed connection layer, wherein the separately formed connection layer wraps around the first and second dies, and wherein the electronics component comprises a substrate having supporting the first and second dies and having lower solder components for attachment to an electronics assembly.

In one example, the first die is disposed in a cavity portion of the electronics component and is at least partially surrounded by a support material in the cavity portion, wherein the separately formed connection layer is attached laterally along a front side of the first die and attached laterally along a portion of the electronics component, wherein the electronics component comprises a substrate having lower solder components for attachment to an electronics assembly.

In one example, a front side of the first die is attached to the electronics component, wherein the separately formed connection layer is attached to a back side of the first die, and wherein an end of separately formed connection layer is attached to heatsink attached to the electronics component such that a portion of the separately formed connection layer extends transverse from the back side of the first die to the heatsink, whereby the separately formed connection layer acts as a heat pipe.

In one example, a front side of the first die is attached to the electronics component, wherein the separately formed connection layer is attached to a back side of the first die, and wherein an end of separately formed connection layer is attached to the electronics component such that a portion of the separately formed connection layer extends transverse from the back side of the first die to the electronics component, and wherein a heatsink is attached to the separately formed connection layer adjacent to and along the back side of the first die, whereby the separately formed connection layer acts as a heat pipe.

In one example, the electronics component comprises an integrated passive device electrically coupled to the die via the separately formed connection layer.

In one example, the separately formed connection layer is wrapped around the integrated passive device from a front side of the first die to a back side of the first die such that the integrated passive device is disposed adjacent an end of the first die.

In one example, the second dielectric layer comprises third opening that exposes a third RDL pad of the at least one redistribution layer, wherein a supplemental integrated passive device is electrically coupled to the third RDL pad.

In one example, the electronics device further comprises a plurality of integrated passive devices attached to the second dielectric layer adjacent a back side of the first die, wherein a mold compound encases the first die and the plurality of integrated passive devices, and wherein solder components are attached along the second dielectric layer opposite the plurality of integrated passive devices for attachment to an electronics assembly.

In one example, the first dielectric layer comprises a first opening that exposes a first RDL pad of the at least one redistribution layer, and wherein the second dielectric layer comprises a second opening that exposes a second RDL pad of the at least one redistribution layer, wherein a first solder component electrically couples the first RDL pad to the first die, and wherein a second solder component electrically couples the second RDL pad to the electronics component.

In one example, the separately formed connection layer extends along a front side of the first die and along at least one side edge of the first die.

In one example, the separately formed connection layer extends along a portion of a back side the first die from the at least one side edge of the first die.

In one example, the electronics device further comprises a second die attached to the back side of the first die, wherein a portion of the separately formed connection layer is disposed between the first and second dies, wherein said portion electrically couples the second die to the electronics component.

In one example, the separately formed connection layer extends along a front side, a side edge, and a back side of the first die.

In one example, the electronics device further comprises a second die attached to a back side of the first die, wherein a portion of the separately formed connection layer is disposed between the first and second dies, wherein said portion electrically couples the second die to the electronics component.

In one example, the separately formed connection layer extends along a front side and a side edge of the first die, wherein the separately formed connection layer comprises a unitary layer from the front side of the first die to the front side of the second die such that the separately formed connection layer is wrapped the side edge of each of the first and second dies.

In one example, the electronics device further comprises a third die attached to a back side of the second die, wherein a portion of the separately formed connection layer is disposed between the second and third dies, wherein said portion electrically couples the third die to the electronics component.

In one example, the electronics device further comprises a memory chip attached to a back side of the first die, wherein a portion of the separately formed connection layer is disposed between the first die and the memory chip, wherein said portion electrically couples the memory chip to the electronics component.

In one example, the electronics device further comprises a second die having a front side attached to the first dielectric layer, wherein a first length of the separately formed connection layer extends along the first die and wherein a second length extends along the second die, and wherein a curved length of the separately formed connection layer extends between the first and second lengths adjacent ends of the first and second dies.

In one example, the electronics device further comprises second and third dies stacked on the first die, wherein a first length of the separately formed connection layer extends along the first die, and wherein a second length extends along the second die from the first length and between the second and third dies, and wherein a third length extends from the second length and along a front side of the third die, such that an entire length of the separately formed connection layer serpentines about the stack of dies.

In one example, the electronics device further comprises a second die attached to the separately formed connection and stacked on the first die, wherein a first length of the separately formed connection layer extends between the first and second dies, and further comprising a third die attached to the electronics component adjacent the first and second dies, wherein a second length extends between the third die and the electronics component, and wherein a portion of the separately formed connection extends transverse between the first and second lengths.

In one example, the electronics device further comprises a second die attached to the separately formed connection and stacked on the first die, and third and fourth dies stacked to each other on the electronics component and adjacent the first and second dies, wherein a first length of the separately formed connection layer extends between the first and second dies and between the third and fourth dies, and wherein a portion of the separately formed connection extends transverse from the first length to the electronics component such that the separately formed connection layer electrically couples the second and fourth dies to the electronics component.

In one example, the electronics device further comprises a plurality of dies electrically coupled to the electronics component via the separately formed connection layer, wherein the separately formed connection layer extends laterally and vertically about the plurality of dies.

In one example, the electronics device further comprises a plurality of electronics devices electrically coupled to the electronics component via the separately formed connection, wherein the separately formed connection layer extends from the electronics component and is attached to each of the plurality of electronic devices.

In one example, at least one side edge is curved such that a portion of the separately formed connection layer wraps around the curved side edge of the first die.

In one example there is provided a connection layer for electrically coupling a die to an electronics component comprising: at least one redistribution layer; a first dielectric layer attached to the at least one redistribution layer and comprising a first opening that exposes a first contact pad of the at least one redistribution layer; and a second dielectric layer attached to the at least one redistribution layer opposite the first dielectric layer such that the at least one redistribution layer is disposed between the first and second dielectric layers, wherein the second dielectric layer comprises a second opening that exposes a second contact pad of the at least one redistribution layer; and wherein the first contact pad and the second contact pad are arranged to electrically couple a die to an electronics component, and wherein the connection layer is flexible and configured to wrap around a side edge of a die.

In one example, the connection layer is formed independently of attaching the die to electronics component.

In one example, the first dielectric layer comprises a plurality of first openings that expose a plurality of first contact pads of the at least one redistribution layer.

In one example, the second dielectric layer comprises a plurality of second openings that expose a plurality of second contact pads of the at least one redistribution layer.

In one example, the connection layer further comprises a plurality of redistribution layers stacked to each other and disposed between the first and second dielectric layers.

In one example, the connection layer further comprises a plurality of interconnect vias disposed throughout the plurality of redistribution layers.

In one example, the first and second dielectric layers and the at least one redistribution layer are each comprised of a flexible material.

In one example, the connection layer is unattached to an electronics component.

In one example, the connection layer further comprises an adhesive layer disposed on outer sides of each of the first and second dielectric layers for adhesion to the die and the electronics component.

In one example there is provided an electronics device comprising: a substrate; a first die supported by the substrate; and a redistribution connection layer electrically coupling the substrate to the first die, the redistribution layer attached to the first die along a first direction and that extends from the first die in a second direction, transverse to the first direction, to an attachment portion of the substrate.

In one example there is provided a method for electrically coupling a die to an electronics comprising: forming a redistribution connection layer comprising at least one redistribution layer disposed between a first dielectric layer and a second dielectric layer; and electrically coupling a first die to an electronics component via the redistribution connection layer, wherein the redistribution connection layer is formed separately from electrically coupling the first die to the electronics assembly via the redistribution connection layer.

In one example, forming the redistribution connection layer further comprises forming a first opening through the first dielectric layer that exposes a first contact pad of the at least one redistribution layer, and forming a second opening through the second dielectric layer that exposes a second contact pad of the at least one redistribution layer.

In one example, electrically coupling the first die to the electronics component further comprises attaching the first die to the first dielectric layer, wherein a first solder component is disposed between the first contact pad and a die pad of the first die to electrically couple the at least one redistribution layer to the first die.

In one example, electrically coupling the first die to the electronics component further comprises attaching the electronics component to the second dielectric layer, wherein a second solder component is disposed between the second contact pad and a substrate pad of the electronics component to electrically couple the at least one redistribution layer to the electronics component, thereby electrically coupling the first die to the electronics component.

In one example, forming the redistribution connection layer further comprises forming a plurality of first openings through the first dielectric layer that expose a plurality of first contact pads of the at least one redistribution layer.

In one example, the method further comprises forming a plurality of second openings through the second dielectric layer that expose a plurality of second contact pads of the at least one redistribution layer.

In one example, the method further comprises forming a plurality of redistribution layers stacked to each other and disposed between the first and second dielectric layers.

In one example, the method further comprises forming a plurality of interconnect vias disposed throughout the plurality of redistribution layers.

In one example, the method further comprises bonding respective solder components between the first die and the at least one redistribution layer about respective first openings of the first dielectric layer, and bonding respective solder components between the electronics component and the at least one redistribution layer about respective second openings of the second dielectric layer.

In one example, the method further comprises attaching the redistribution connection layer to a front side of the first die, and further comprising wrapping the redistribution connection layer around a left side edge and attaching the redistribution connection layer to a left back side portion of the first die.

In one example, the method further comprises wrapping the redistribution connection layer around a right side edge and attaching the redistribution connection layer to a right back side portion of the first die.

In one example, the method further comprises stacking a second die to the back side of the first die such that end portions of the redistribution connection layer are disposed between the first and second dies, wherein the second die is electrically coupled to electronics component via the ends of the redistribution connection layer.

In one example, the method further comprises: attaching the redistribution connection layer to a front side of the first die; wrapping the redistribution connection layer around a first side edge of the first die; attaching the redistribution connection layer to a back side of the first die; and attaching a second die to the redistribution connection layer adjacent the first die such that a length of the redistribution connection layer is attached between the first and second dies, wherein the second die is electrically coupled to the electronics component via the redistribution connection layer.

In one example, the method further comprises wrapping the redistribution connection layer around a first side edge of the second die; attaching the redistribution connection layer to a back side of the second die; and attaching a third die to the redistribution connection layer adjacent the second die such that a length of the redistribution connection layer is attached between the second and third dies, wherein the third die is electrically coupled to the electronics component via the redistribution connection layer.

In one example, the method further comprises attaching the first die and a second die to the first dielectric layer such that the first die is laterally separated from the second die by a fold portion of the redistribution connection layer; depositing a support material between side edges of the first and second die; and folding the redistribution connection layer about the fold portion and attaching the first die to the second die via an adhesive such that the second die is stacked to the first die.

In one example, the method further comprises attaching a third die to the redistribution connection layer such that the second die is laterally separated from the third die by a supplemental fold portion; depositing a supplemental support material between side edges of the second and third die; and folding the redistribution connection layer about the supplemental fold portion and attaching the third die to the first die via an adhesive such that the third die is stacked to the second die, whereby the redistribution connection layer serpentines along and between the first, second, and third dies.

In one example, the method further comprises attaching a portion of the redistribution connection layer to an attachment portion of the electronics component comprising a substrate; disposing the attached first die, second die, and redistribution connection layer at least partially in a cavity in the substrate to minimize a height of the electronics device; and encapsulating the first die, second die, and redistribution connection layer with an encapsulate material.

In one example, the method further comprises: attaching the first die to the first dielectric layer; attaching the second die to the second dielectric layer such that the first die is laterally separated from the second die by a fold portion of the redistribution connection layer; depositing a support material adjacent a side edge of the first die; and folding the redistribution connection layer about the fold portion and attaching the redistribution connection layer to the first die via an adhesive such that the second die is stacked to the first die.

In one example, the method further comprises attaching a front side of a second die to the electronics component comprising a substrate; attaching the first die to the redistribution connection layer; attaching a fold portion of the redistribution connection layer to the substrate; depositing a support material adjacent a side edge of the first die and the fold portion; and folding the redistribution connection layer and the attached first die about the fold portion and attaching the redistribution connection layer to the second die via an adhesive such that the second die is stacked to the first die.

In one example, the method further comprises attaching the redistribution connection layer to a plurality of dies supported by the electronics component comprising a substrate; and folding at least one portion of the redistribution connection layer from an attachment portion to the substrate to a side of at least one of the dies of the plurality of dies.

In one example, the method further comprises attaching the redistribution connection layer to a plurality of dies supported by the electronics component comprising a substrate; and folding at least one portion of the redistribution connection layer from an attachment portion to the substrate to a side of at least one of the dies of the plurality of dies.

In one example, the method further comprises attaching a front side of the first die to the first dielectric layer of the redistribution connection layer; attaching ends of the first dielectric layer to the electronics component comprising a substrate such that the first die is disposed in a cavity of the substrate; and depositing a support material about the cavity to support the first die.

In one example, the method further comprises attaching a front side of the first die to the electronics component comprising a substrate; attaching the redistribution connection layer along a backside of the first die; and attaching ends of the redistribution connection layer to respective heatsinks and disposed in the substrate such that the redistribution connection layer acts as a heat pipe that removes heat from the first die.

In one example, the method further comprises attaching a front side of the first die to the electronics component comprising a substrate; attaching the redistribution connection layer along a backside of the first die; and attaching ends of the redistribution connection layer to respective substrate attachment portions; and attaching a heatsink to the redistribution connection layer adjacent the back side of the first die such that the redistribution connection layer acts as a heat pipe that removes heat from the first die in conjunction with the heatsink.

In one example, the method further comprises attaching a front side of the first die to the first dielectric layer of the redistribution connection layer; attaching a first integrated passive device to the first dielectric layer adjacent a right side edge of the first die; wrapping the redistribution connection layer around the first integrated passive device and attaching the redistribution connection layer to a back side of the first die.

In one example, the method further comprises attaching a second integrated passive device to the first dielectric layer adjacent a left side edge of the first die; wrapping the redistribution connection layer around the second integrated passive device and attaching the redistribution connection layer to the back side of the first die.

In one example, the method further comprises attaching a plurality of integrated passive devices to the second dielectric layer adjacent the back side of the first die; and attaching the second dielectric layer to the electronics component opposite the plurality of integrated devices, whereby the plurality of integrated devices are electrically coupled to the electronics component via the redistribution connection layer.

In one example there is provided a method of forming a redistribution connection layer for electrically coupling a die to an electronics component comprising: forming at least one redistribution layer; attaching a first dielectric layer to the at least one redistribution layer, the first dielectric layer comprising a first opening that exposes a first contact pad of the at least one redistribution layer; and attaching a second dielectric layer to the at least one redistribution layer opposite the first dielectric layer such that the at least one redistribution layer is disposed between the first and second dielectric layers, wherein the second dielectric layer comprises a second opening that exposes a second contact pad of the at least one redistribution layer, wherein the first and second contact pads electrically couple a die to an electronics component.

In one example, the method further comprises forming a plurality of openings in each of the first and second dielectric layers.

In one example, the method further comprises forming a plurality of redistribution layers stacked to each other before attaching the first and second dielectric layers.

In one example, the method further comprises forming a plurality of interconnect vias disposed throughout the plurality of redistribution layers.

In one example, the at least one distribution layer and the first and second dielectric layers are comprised of flexible material configured to wrap around a side edge of the die.

In one example, the method further comprises depositing an adhesive layer one outer side of each of the first and second dielectric layers.

Circuitry used in electronic components or devices (e.g., a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronics device comprising:
   an electronics component;
   a first die; and
   a separately formed connection layer comprising:
      a first dielectric layer;
      a second dielectric layer; and
      at least one redistribution layer disposed between the first and second dielectric layers and electrically coupling the first die to the electronics component, wherein all of the first dielectric layer, the second dielectric layer, and the at least one redistribution layer of the separately formed connection layer wrap around a side edge of the first die.

2. The electronics device of claim 1, wherein the first dielectric layer comprises a first opening that exposes a first redistribution layer (RDL) pad of the at least one redistribution layer, and comprises a second opening that exposes a second RDL pad of the at least one redistribution layer, wherein a first solder component electrically couples the first RDL pad to the first die, and wherein a second solder component electrically couples the second RDL pad to the electronics component.

3. The electronics device of claim 2, wherein the separately formed connection layer is attached to the first die along a first direction, wherein the separately formed connection layer extends from the first die in a second direction transverse to the first direction, such that the separately formed connection layer is flexible.

4. The electronics device of claim 2, wherein a portion of the separately formed connection layer is curved from the first die to the electronics component.

5. The electronics device of claim 2, wherein the separately formed connection layer comprises a fold portion that extends from the first die to the electronics component.

6. The electronics device of claim 2, further comprising a second die having an front side attached to the first dielectric layer and a back side attached to the first die, such that a first length of the separately formed connection layer is substantially parallel to a second length of the separately formed connection layer, wherein a curved length of the separately formed connection layer extends between the first and second lengths.

7. The electronics device of claim 2, further comprising a second die disposed between the electronics component and the first die such that a front side of the second die is attached to the electronics component, wherein a first length of the separately formed connection layer is disposed between the first and second dies, and wherein a curved length of the separately formed connection layer extends from the first length to the attached electronics component.

8. The electronics device of claim 2, further comprising a second die disposed between the electronics component and the first die such that a front side of the second die is attached to the separately formed connection layer, wherein one end of the separately formed connection layer is attached to the electronics component and the other end is attached to a front side of the second die such that the separately formed connection layer is attached along a front side of the first die and the front side of the second die.

9. The electronics device of claim 2, wherein the first die is disposed in a recess portion of the electronics component and is at least partially surrounded by a support material in the recess portion, wherein the separately formed connection layer is attached laterally along a front side of the first die and attached laterally along a portion of the electronics component, wherein the electronics component comprises a substrate having lower solder components for attachment to an electronics assembly.

10. The electronics device of claim 2, wherein a front side of the first die is attached to the electronics component, wherein the separately formed connection layer is attached to a back side of the first die, and wherein an end of separately formed connection layer is attached to heatsink attached to the electronics component such that a portion of the separately formed connection layer extends transverse from the back side of the first die to the heatsink, whereby the separately formed connection layer acts as a heat pipe.

11. The electronics device of claim 2, wherein a front side of the first die is attached to the electronics component, wherein the separately formed connection layer is attached to a back side of the first die, and wherein an end of separately formed connection layer is attached to the electronics component such that a portion of the separately formed connection layer extends transverse from the back side of the first die to the electronics component, and wherein a heatsink is attached to the separately formed connection layer adjacent to and along the back side of the first die, whereby the separately formed connection layer acts as a heat pipe.

12. The electronics device of claim 2, wherein the electronics component comprises an integrated passive device electrically coupled to the die via the separately formed connection layer.

13. The electronics device of claim 1, wherein the first dielectric layer comprises a first opening that exposes a first RDL pad of the at least one redistribution layer, and wherein the second dielectric layer comprises a second opening that exposes a second RDL pad of the at least one redistribution layer, wherein a first solder component electrically couples the first RDL pad to the first die, and wherein a second solder component electrically couples the second RDL pad to the electronics component.

14. The electronics device of claim 1, wherein the separately formed connection layer extends along a front side of the first die and along at least one side edge of the first die.

15. The electronics device of claim 1, wherein the separately formed connection layer extends along a front side, a side edge, and a back side of the first die.

16. The electronics device of claim 1, further comprising a second die having a front side attached to the first dielectric layer, wherein a first length of the separately formed connection layer extends along the first die and wherein a second length extends along the second die, and wherein a curved length of the separately formed connection layer extends between the first and second lengths adjacent ends of the first and second dies.

17. The electronics device of claim 1, further comprising second and third dies stacked on the first die, wherein a first length of the separately formed connection layer extends along the first die, and wherein a second length extends along the second die from the first length and between the second and third dies, and wherein a third length extends from the second length and along a front side of the third die, such that an entire length of the separately formed connection layer serpentines about the stack of dies.

18. The electronics device of claim 1, further comprising a second die attached to the separately formed connection and stacked on the first die, wherein a first length of the separately formed connection layer extends between the first and second dies, and further comprising a third die attached to the electronics component adjacent the first and second dies, wherein a second length extends between the third die and the electronics component, and wherein a portion of the separately formed connection extends transverse between the first and second lengths.

19. The electronics device of claim 1, further comprising a second die attached to the separately formed connection and stacked on the first die, and third and fourth dies stacked to each other on the electronics component and adjacent the first and second dies, wherein a first length of the separately formed connection layer extends between the first and second dies and between the third and fourth dies, and wherein a portion of the separately formed connection extends transverse from the first length to the electronics component such that the separately formed connection layer electrically couples the second and fourth dies to the electronics component.

20. The electronics device of claim 1, further comprising a plurality of dies electrically coupled to the electronics component via the separately formed connection layer, wherein the separately formed connection layer extends laterally and vertically about the plurality of dies.

21. The electronics device of claim 1, further comprising a plurality of electronics devices electrically coupled to the electronics component via the separately formed connection, wherein the separately formed connection layer extends from the electronics component and is attached to each of the plurality of electronic devices.

22. The electronics device of claim 1, wherein at least one side edge is curved such that a portion of the separately formed connection layer wraps around the curved side edge of the first die.

23. A method for electrically coupling a die to an electronics component, the method comprising:
    forming a redistribution connection layer comprising at least one redistribution layer disposed between a first dielectric layer and a second dielectric layer; and
    electrically coupling a first die to an electronics component via the redistribution connection layer, wherein the redistribution connection layer is formed separately from electrically coupling the first die to the electronics assembly via the redistribution connection layer, and wherein all of the first dielectric layer, the second dielectric layer, and the at least one redistribution layer of the redistribution connection layer wrap around a side edge of the first die.

24. The method of claim 23, wherein forming the redistribution connection layer further comprises forming a first opening through the first dielectric layer that exposes a first contact pad of the at least one redistribution layer, and forming a second opening through the second dielectric layer that exposes a second contact pad of the at least one redistribution layer.

25. The method of claim 23, wherein forming the redistribution connection layer further comprises forming a plurality of first openings through the first dielectric layer that expose a plurality of first contact pads of the at least one redistribution layer.

* * * * *